US008213475B2

(12) United States Patent
Takagi et al.

(10) Patent No.: US 8,213,475 B2
(45) Date of Patent: Jul. 3, 2012

(54) GROUP-III NITRIDE SEMICONDUCTOR LASER DEVICE, AND METHOD FOR FABRICATING GROUP-III NITRIDE SEMICONDUCTOR LASER DEVICE

(75) Inventors: Shimpei Takagi, Osaka (JP); Yusuke Yoshizumi, Itami (JP); Koji Katayama, Osaka (JP); Masaki Ueno, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/209,101

(22) Filed: Aug. 12, 2011

(65) Prior Publication Data

US 2012/0027039 A1    Feb. 2, 2012

(30) Foreign Application Priority Data

Jan. 18, 2010 (JP) .................................. 2010-008414

(51) Int. Cl.
*H01S 5/323* (2006.01)
*H01L 29/06* (2006.01)
*H01L 29/12* (2006.01)

(52) U.S. Cl. ....................................... 372/45.01; 257/11
(58) Field of Classification Search ..................... 257/11
See application file for complete search history.

(56) References Cited

U.S. PATENT DOCUMENTS

| 6,596,079 B1 | 7/2003 | Vaudo et al. |
| 6,756,562 B1 | 6/2004 | Kurosawa et al. |
| 7,176,479 B2 * | 2/2007 | Ohba ............................. 257/12 |
| 7,933,303 B2 | 4/2011 | Yoshizumi et al. |
| 7,968,864 B2 * | 6/2011 | Akita et al. ..................... 257/11 |
| 2005/0023260 A1 | 2/2005 | Takyu et al. |

(Continued)

FOREIGN PATENT DOCUMENTS

JP    2004-235626    8/2004

(Continued)

OTHER PUBLICATIONS

Shuji Nakamura et al., "InGaN-Based Multi-Quantum-Well-Structure Laser Diodes", Japanese Journal of Applied Physics, vol. 35, Part 2, No. 1B, pp. L74-L76 15 (1996).

(Continued)

*Primary Examiner* — Seahvosh Nikmanesh
(74) *Attorney, Agent, or Firm* — Venable LLP; Michael A. Sartori

(57) ABSTRACT

Provided is a group-III nitride semiconductor laser device with a laser cavity enabling a low threshold current, on a semipolar surface of a support base the c-axis of a hexagonal group-III nitride of which tilts toward the m-axis. In a laser structure 13, a first surface 13a is a surface opposite to a second surface 13b and first and second fractured faces 27, 29 extend each from an edge 13c of the first surface 13a to an edge 13d of the second surface 13b. A scribed mark SM1 extending from the edge 13c to the edge 13d is made, for example, at one end of the first fractured face 27, and the scribed mark SM1 or the like has a depressed shape extending from the edge 13c to the edge 13d. The fractured faces 27, 29 are not formed by dry etching and thus are different from the conventional cleaved facets such as c-planes, m-planes, or a-planes. It is feasible to use emission of a band transition enabling a low threshold current.

15 Claims, 20 Drawing Sheets

U.S. PATENT DOCUMENTS

| | | |
|---|---|---|
| 2007/0093073 A1 | 4/2007 | Farrell, Jr. et al. |
| 2009/0098712 A1 | 4/2009 | Taguchi et al. |
| 2010/0096615 A1 | 4/2010 | Okamoto et al. |

FOREIGN PATENT DOCUMENTS

| | | |
|---|---|---|
| JP | 2008-109066 | 5/2008 |
| JP | 2008-543089 | 11/2008 |
| JP | 2009-099681 | 5/2009 |
| JP | 4475357 | 6/2010 |

OTHER PUBLICATIONS

A. Atsushi Yamaguchi, "Anisotropic Optical Matrix Elements in Strained GaN Quantum Wells on Semipolar and Nonpolar Substrates", Japanese Journal of Applied Physics, vol. 46, No. 33, pp. L789-L791 (2007).

Hirokuni Asamizu et al., "Demonstration of 426 nm InGaN/GaN Laser Diodes Fabricated on Free-Standing Semipolar (1122) Gallium Nitride Substrates", Applied Physics Express 1, pp. 091102-1-091102.3 (2008).

Enya et al. "531 nm Green Lasing of InGaN Based Laser Diodes on Semi-Polar {20-21} Free-Standing GaN Substrates," Applied Physics Express, vol. 2, No. 8, pp. 082101-1-082101-3, (Jul. 17, 2009).

Yoshizumi et al. "Continuous-Wave Operation of 520 nm Green InGaN-Based Laser Diodes on Semi-Polar {20-21} GaN Substrates," Applied Physics Express vol. 2, No. 9, pp. 092101-1-092101-3, (Aug. 21, 2009).

Kyono et al., "Optical Polarization Characteristics of InGaN Quantum Wells for Green Laser Diodes on Semi-Polar {20-21} GaN Substrates," Applied Physics Express, vol. 3, pp. 0110031-011003-3 (2010).

"Green Semiconductor Laser Moving Toward Practical Application—Sumitomo Electric Industries, Ltd.," Published in: Nikkan Kogyo Shinbun, (Aug. 20, 2009).

"Green Semiconductor Laser Oscillates at Last Sumitomo Electric Succeeded in Pulse Driving," Published in: Nikkei Electronics (Aug. 24, 2009).

\* cited by examiner

Fig.2
(a)
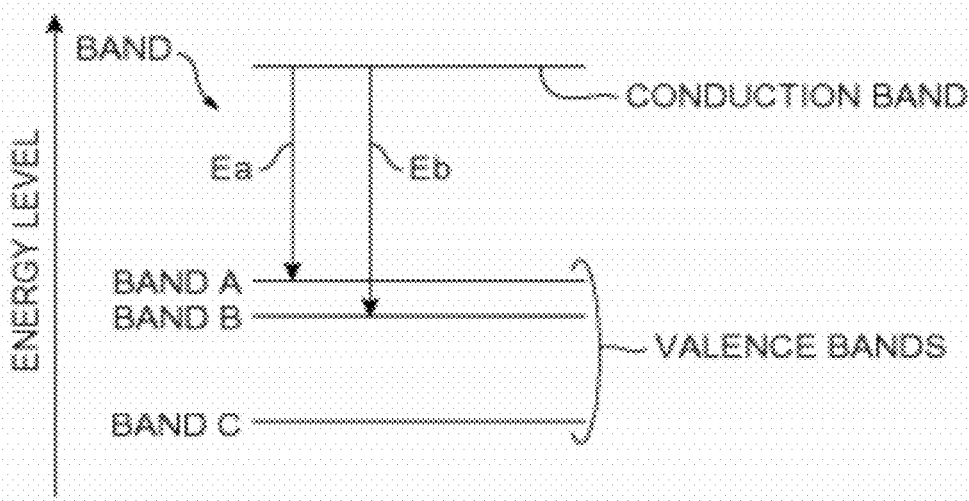
(b)
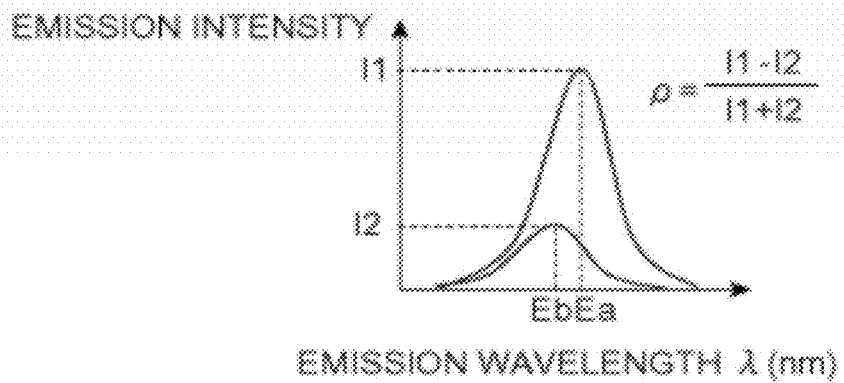

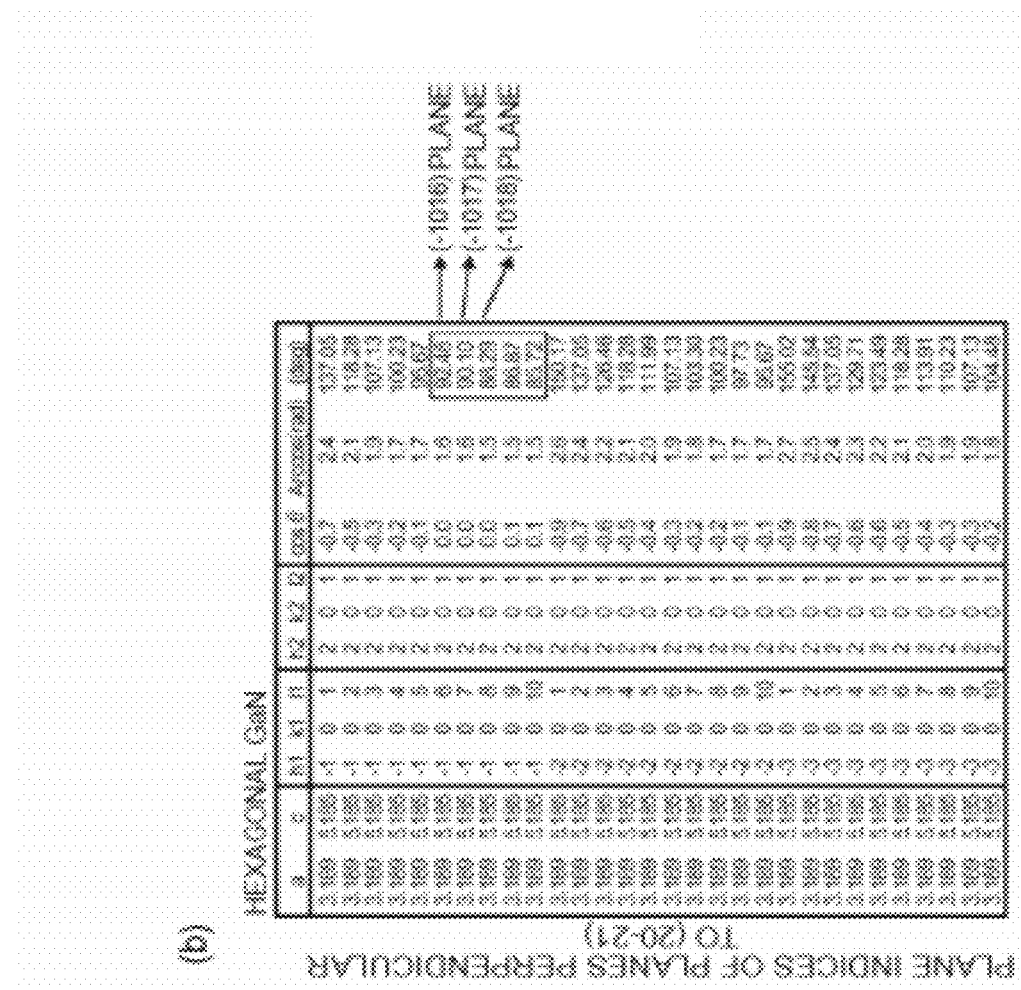
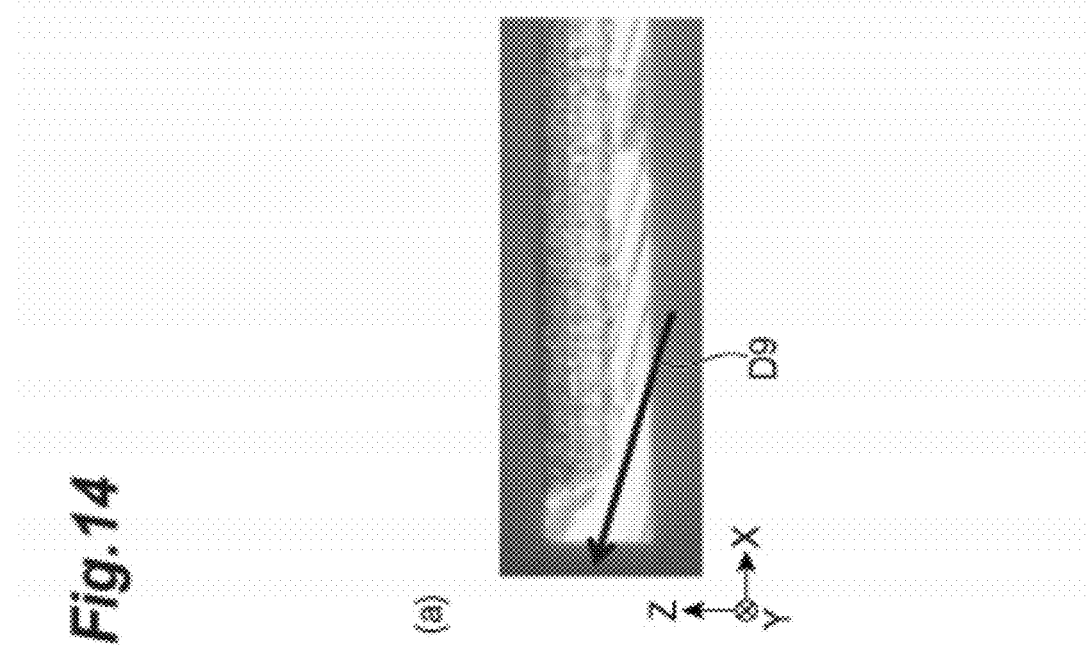
Fig. 14

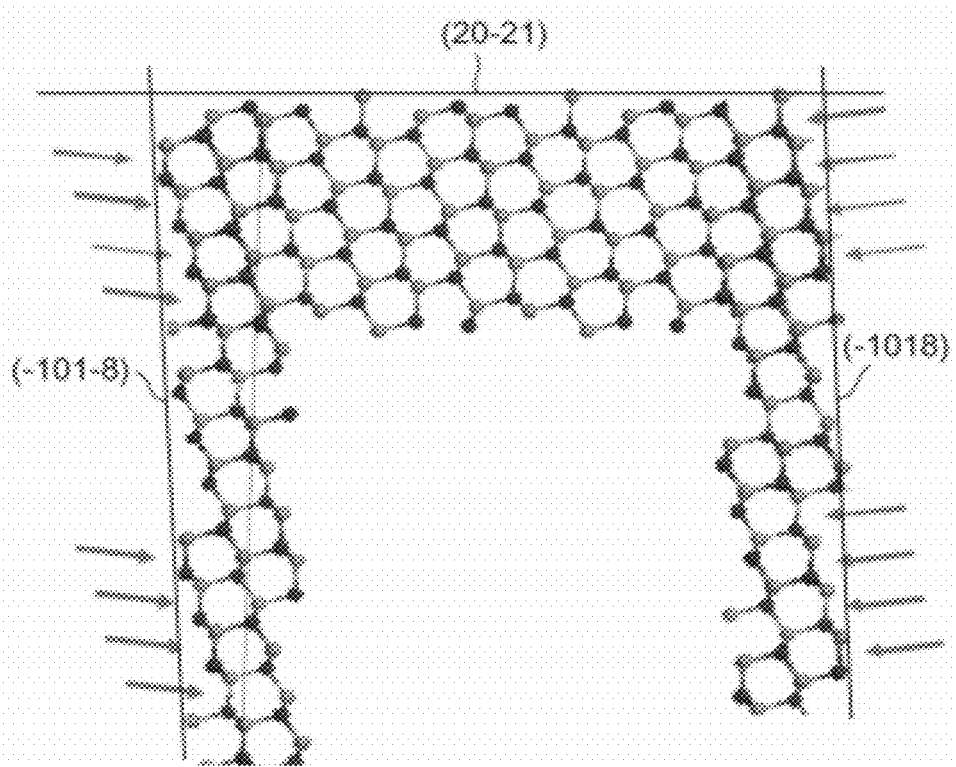

GROUP-III NITRIDE SEMICONDUCTOR LASER DEVICE, AND METHOD FOR FABRICATING GROUP-III NITRIDE SEMICONDUCTOR LASER DEVICE

CROSS-REFERENCE TO RELATED APPLICATIONS

This application is a Divisional of U.S. patent application Ser. No. 12/836,281, filed Jul. 14, 2010, which claims the benefit of Japan Patent Application No. 2010-008414, filed Jan. 18, 2010, all of which are incorporated herein by reference in their entirety.

BACKGROUND OF THE INVENTION

1. Field of the Invention

The present invention relates to a group-III nitride semiconductor laser device, and a method for fabricating the group-III nitride semiconductor laser device.

2. Related Background Art

Non-patent Document 1 (Jpn. J. Appl. Phys. Vol. 35, (1996) L74-L76) describes a semiconductor laser made on a c-plane sapphire substrate. The mirror faces of the semiconductor laser are formed by dry etching. The Document 1 shows micrographs of the laser cavity mirror faces of the laser, and describes that the roughness of the end faces is about 50 nm.

Non-patent Document 2 (Appl. Phys. Express 1 (2008) 091102) describes a semiconductor laser formed on a (11-22) plane GaN substrate. The mirror faces of the semiconductor laser are formed by dry etching.

Non-patent Document 3 (Jpn. J. Appl. Phys. Vol. 46, (2007) L789) describes a gallium nitride (GaN)-based semiconductor laser. It proposes generation of laser light polarized in an off direction of the c-axis of the substrate, in order to use m-plane cleaved facets for the laser cavity. Specifically, this Document describes increase of the well thickness on a non-polar surface and decrease of the well thickness on a semipolar surface.

SUMMARY OF THE INVENTION

The band structure of the GaN-based semiconductor has some possible transitions capable of lasing. According to the Inventor's knowledge, it is considered that in the group-III nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the above possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the laser cavity mirrors. For this reason, the laser cavity mirrors have been made heretofore by forming dry-etched facets of semiconductor layers by reactive ion etching (RIE). What is now desired is an improvement in the laser cavity mirrors, which have been formed by RIE, in terms of perpendicularity to the laser waveguide, flatness of the dry-etched facets, or ion damage. It becomes a heavy burden to find process conditions for obtaining excellent dry-etched faces in the current technical level.

As far as the inventor knows, in a single group-III nitride semiconductor laser device formed on the semipolar surface, no one has succeeded heretofore in achieving both of the laser waveguide, which extends in the inclination direction (off direction) of the c-axis, and the end faces for laser cavity mirrors formed without use of dry etching.

The present invention has been accomplished in view of the above-described circumstances. It is an object of the present invention to provide a group-III nitride semiconductor laser device with a laser cavity enabling a low threshold current, on the semipolar surface of a support base that tilts with respect to the c-axis toward the m-axis of a hexagonal group-III nitride. It is another object of the present invention to provide a method of fabricating the group-III nitride semiconductor laser device.

A group-III nitride semiconductor laser device according to an aspect of the present invention comprises: (a) a laser structure including a support base and a semiconductor region, the support base comprising a hexagonal group-III nitride semiconductor and having a semipolar principal surface, and the semiconductor region being provided on the semipolar principal surface of the support base; and (b) an electrode being provided on the semiconductor region of the laser structure, the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the support base tilting at a finite angle ALPHA with respect to the normal axis toward an m-axis of the hexagonal group-III nitride semiconductor, the angle ALPHA being in a range of not less than 45° and not more than 80° or in a range of not less than 100° and not more than 135°, the laser structure comprising first and second fractured faces, the first and second fractured faces intersecting with an m-n plane defined by the m-axis of the hexagonal group-III nitride semiconductor and the normal axis, a laser cavity of the group-III nitride semiconductor laser device including the first and second fractured faces, the laser structure including first and second surfaces, the second surface being opposite to the first surface, the semiconductor region being located between the first surface and the support base, each of the first and second fractured faces extending from an edge of the first surface to an edge of the second surface, the laser structure having a scribed mark, the scribed mark extending from the edge of the first surface to the edge of the second surface, at one end of the first fractured face, and the scribed mark having a depressed shape, the depressed shape extending from the edge of the first surface to the edge of the second surface. In this group-III nitride semiconductor laser device, since the fractured face is provided along the scribed mark of the depressed shape extending from the edge of the first surface to the edge of the second surface at one end of the first fractured face, the fractured face is expected to have sufficient perpendicularity and flatness, and thus, the fractured face can have the perpendicularity and flatness enough for a laser cavity mirror. Therefore, it is feasible to provide the group-III nitride semiconductor laser device with the laser cavity enabling a low threshold current.

In this group-III nitride semiconductor laser device, an end face of the support base and an end face of the semiconductor region are exposed in each of the first and second fractured faces, and an angle between the end face in the active layer of the semiconductor region and a reference plane perpendicular to the m-axis of the support base of the hexagonal nitride semiconductor is in a range of not less than (ALPHA−5)° and not more than (ALPHA+5)° in a first plane defined by the c-axis and the m-axis of the group-III nitride semiconductor. This group-III nitride semiconductor laser device has the end faces that satisfy the foregoing perpendicularity, concerning the angle taken for one of the c-axis and the m-axis to the other.

In this group-III nitride semiconductor laser device, the angle is in a range of not less than −5° and not more than +5° on a second plane perpendicular to the first plane and the normal axis. This group-III nitride semiconductor laser device can have the end faces satisfying the foregoing perpendicularity, concerning the angle defined on the plane perpendicular to the normal axis to the semipolar surface.

In this group-III nitride semiconductor laser device, a thickness of the support base is not less than 50 μm and not more than 150 μm. In this group-III nitride semiconductor laser device, when the thickness is not less than 50 μm, the handling thereof becomes easier and production yield becomes higher. When the thickness is not more than 100 μm, it is better for obtaining good-quality fractured faces for a laser cavity.

In this group-III nitride semiconductor laser device, the angle between the normal axis and the c-axis of the hexagonal group-III nitride semiconductor falls within a range of not less than 63° and not more than 80° or within a range of not less than 100° and not more than 117°. In this group-III nitride semiconductor laser device, when the angle is in a range of not less than 63° and not more than 80° or in a range of not less than 100° and not more than 117°, end faces made by press are highly likely to be faces nearly perpendicular to the principal surface of the substrate. When the angle is in a range of more than 80° and less than 100°, it may result in failing to achieve desired flatness and perpendicularity.

In this group-III nitride semiconductor laser device, laser light from the active layer is polarized in a direction of an a-axis of the hexagonal group-III nitride semiconductor. In this group-III nitride semiconductor laser device, a band transition allowing for achievement of a low threshold current has polarized nature.

In this group-III nitride semiconductor laser device, light in an LED mode of the group-III nitride semiconductor laser device includes a polarization component I1 in a direction of an a-axis of the hexagonal group-III nitride semiconductor, and a polarization component I2 in a direction indicated by a projection of the c-axis of the hexagonal group-III nitride semiconductor onto the principal surface, and the polarization component I1 is greater than the polarization component I2. This III-nitride semiconductor laser device can lase with a laser cavity to emit light in a mode having large emission intensity in the LED mode.

In this group-III nitride semiconductor laser device, the semipolar principal surface is slightly tilted in a range of not less than −4° and not more than +4° with respect to any one of {20-21} plane, {10-11} plane, {20-2-1} plane, and {10-1-1} plane. This group-III nitride semiconductor laser device allows for provision of first and second end faces with flatness and perpendicularity enough to construct the laser cavity of the group-III nitride semiconductor laser device or without ion damage, even on the slightly tilting surface from these typical semipolar surfaces.

In this group-III nitride semiconductor laser device, the semipolar principal surface is one of {20-21} plane, {10-11} plane, {20-2-1} plane, and {10-1-1} plane. This group-III nitride semiconductor laser device allows for provision of first and second end faces with flatness and perpendicularity enough to construct the laser cavity of the group-III nitride semiconductor laser device or without ion damage, even on these typical semipolar surfaces.

In this group-III nitride semiconductor laser device, a stacking fault density of the support base is not more than $1 \times 10^4$ cm$^{-1}$. In this group-III nitride semiconductor laser device, because the stacking fault density is not more than $1 \times 10^4$ cm$^{-1}$, the flatness and/or perpendicularity of the fractured faces is unlikely to be disturbed for a certain accidental reason.

In this group-III nitride semiconductor laser device, the support base comprises any one of GaN, AlGaN, AlN, InGaN, and InAlGaN. In this group-III nitride semiconductor laser device, when the substrate used comprises one of these GaN-based semiconductors, it becomes feasible to obtain the first and second end faces applicable to the cavity. Use of an AlN substrate or AlGaN substrate allows for increase in the degree of polarization and for enhancement of optical confinement by virtue of low refractive index. Use of an InGaN substrate allows for decrease in the degree of lattice mismatch between the substrate and the light emitting layer and for improvement in crystal quality.

This group-III nitride semiconductor laser device further comprises a dielectric multilayer film provided on at least one of the first and second fractured faces. In this group-III nitride semiconductor laser device, an end face coating is also applicable to the fractured faces. The end face coat allows for adjustment of reflectance.

In this group-III nitride semiconductor laser device, the active layer includes a light emitting region provided so as to generate light at a wavelength of not less than 360 nm and not more than 600 nm. Since this group-III nitride semiconductor laser device makes use of the semipolar surface, the resultant group-III nitride semiconductor laser device makes efficient use of polarization in the LED mode, and achieves a low threshold current.

In this group-III nitride semiconductor laser device, the active layer includes a quantum well structure provided so as to generate light at a wavelength of not less than 430 nm and not more than 550 nm. Since this group-III nitride semiconductor laser device makes use of the semipolar surface, it allows for increase in quantum efficiency through both decrease of the piezoelectric field and improvement in crystal quality of the light emitting layer region, and it can generate light at the wavelength of not less than 430 nm and not more than 550 nm.

A group-III nitride semiconductor laser device according to another aspect of the present invention comprises: (a) a laser structure including a support base and a semiconductor region, the support base comprising a hexagonal group-III nitride semiconductor and having a semipolar principal surface, the semiconductor region being provided on the semipolar principal surface of the support base; and (b) an electrode being provided on the semiconductor region of the laser structure, the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the support base tilting at a finite angle ALPHA with respect to the normal axis toward an m-axis of the hexagonal group-III nitride semiconductor, the angle ALPHA being in a range of not less than 45° and not more than 80° or in a range of not less than 100° and not more than 135°, the laser structure including first and second surfaces, the second surface being opposite to the first surface, the semiconductor region being located between the first surface and the support base, the laser structure having first and second scribed marks, the first and second scribed marks being provided at an end of the laser structure and extending along a plane defined by an a-axis of the hexagonal group-III nitride semiconductor and the normal axis, each of the first and second scribed marks having a depressed shape, the depressed shape extending from an edge of the first surface to an edge of the second surface, the end of the laser structure having a fractured face, the fractured face connecting respective edges of the first and second scribed marks with the respective edges of the first and second surfaces, and a laser cavity of the group-III nitride semiconductor laser device including the fractured face. In this group-III nitride semiconductor laser device, since the fractured face is provided along the scribed marks of the depressed shape each extending from the edge of the first surface to the edge of the second surface at an end of the fractured face, the fractured face is expected to have sufficient perpendicularity and flatness, and the fractured face can have the perpendicularity and flatness enough for a laser cavity mirror. Therefore, it is feasible to provide the group-III nitride semiconductor laser device with the laser cavity enabling a low threshold current.

A method for fabricating a group-III nitride semiconductor laser device according to another aspect of the present invention comprises the steps of: (a) preparing a substrate of a hexagonal group-III nitride semiconductor, the substrate having a semipolar principal surface; (b) forming a substrate product, the substrate product having a laser structure, an anode electrode and a cathode electrode, the laser structure including the substrate and a semiconductor region, the semiconductor region being formed on the semipolar principal surface, and; (c) scribing a first surface of the substrate product in part in a direction of an a-axis of the hexagonal group-III nitride semiconductor; and (d) carrying out breakup of the substrate product by press against a second surface of the substrate product, to form another substrate product and a laser bar, the first surface being opposite to the second surface, the semiconductor region being located between the first surface and the substrate, the laser bar having first and second end faces, the first and second end faces being formed by the breakup, the first and second end faces extending from the first surface to the second surface, the first and second end faces constituting a laser cavity of the group-III nitride semiconductor laser device, the anode electrode and the cathode electrode being formed on the laser structure, the semiconductor region comprising a first cladding layer of a first conductivity type gallium nitride-based semiconductor, a second cladding layer of a second conductivity type gallium nitride-based semiconductor and an active layer, the active layer being provided between the first cladding layer and the second cladding layer, the first cladding layer, the second cladding layer, and the active layer being arranged along a normal axis to the semipolar principal surface, the active layer comprising a gallium nitride-based semiconductor layer, a c-axis of the hexagonal group-III nitride semiconductor of the substrate tilting at an finite angle ALPHA with respect to the normal axis toward an m-axis of the hexagonal group-III nitride semiconductor, the angle ALPHA being in a range of not less than 45° and not more than 80° or in a range of not less than 100° and not more than 135°, the first and second end faces intersecting with an m-n plane defined by the m-axis of the hexagonal group-III nitride semiconductor and the normal axis, an end face of the active layer in each of the first and second end faces making an angle in a range of not less than (ALPHA−5)° and not more than (ALPHA+5)° on a plane defined by the c-axis and the m-axis of the hexagonal group-III nitride semiconductor, with respect to a reference plane perpendicular to the m-axis of the substrate comprised of the hexagonal nitride semiconductor, and the step of scribing being comprised of forming along the a-axis of the hexagonal group-III nitride semiconductor, a plurality of scribed through-holes with a shape penetrating the substrate product from the first surface to the second surface thereof and elongated in the direction of the a-axis of the hexagonal group-III nitride semiconductor. According to this method, the scribed through-holes are provided so as to penetrate the substrate product from the first surface to the second surface thereof, and the substrate product is then broken up; therefore, the end faces formed by the breakup provide laser cavity mirror faces with flatness and perpendicularity enough to construct a laser cavity from the first surface side to the second surface side, or without ion damage.

In this method for fabricating the group-III nitride semiconductor laser device, the scribed through-holes are formed by laser irradiation to the first surface or the second surface of the laser structure, using a laser scriber. According to this method, the laser may be applied to either the first surface or the second surface. Particularly, when the laser is applied to the second surface, damages and debris of an epitaxially grown surface (epitaxial surface) are reduced.

The above objects and other objects, features, and advantages of the present invention can more readily become clear in view of the following detailed description of the preferred embodiments of the present invention proceeding with reference to the accompanying drawings.

BRIEF DESCRIPTION OF THE DRAWINGS

FIG. 2 is a drawing showing a band structure in an active layer in the group-III nitride semiconductor laser device.

FIG. 14 is a drawing showing angles formed by (20-21) plane and other plane orientations (plane indices).

FIG. 20 is a drawing showing atomic arrangements in (20-21) plane, (-101-8) plane, and (-1018) plane.

DESCRIPTION OF THE PREFERRED EMBODIMENTS

The expertise of the present invention can be readily understood in view of the following detailed description with reference to the accompanying drawings provided by way of illustration only. The following will describe embodiments of the group-III nitride semiconductor laser device and the method of fabricating the group-III nitride semiconductor laser device according to the present invention, with reference to the accompanying drawings. The same portions will be denoted by the same reference symbols if possible.

Figure 1:
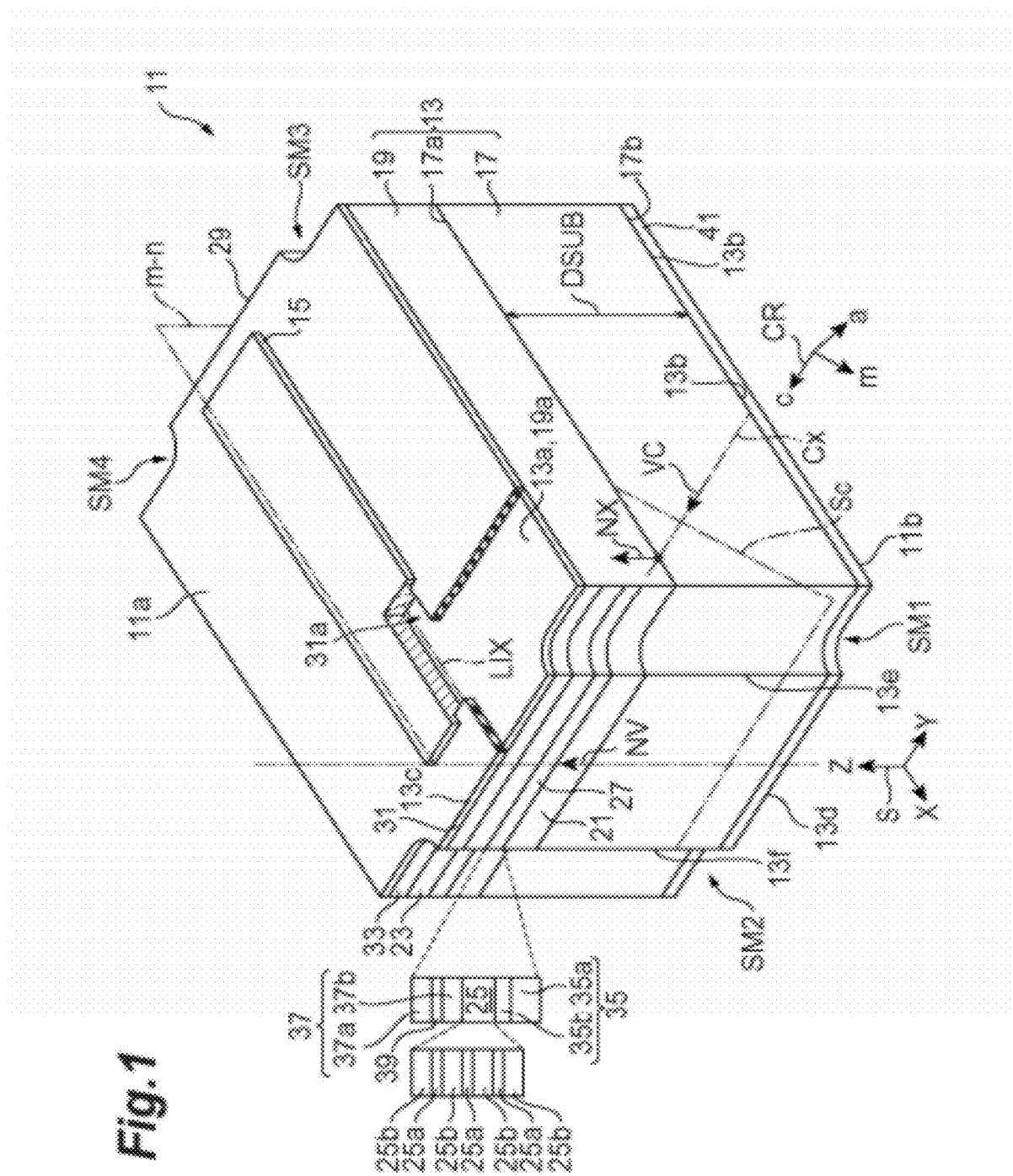
FIG. 1 is a drawing schematically showing a structure of a group-III nitride semiconductor laser device according to an embodiment of the present invention.

FIG. 1 is a drawing schematically showing a structure of a group-III nitride semiconductor laser device according to an embodiment of the present invention. The group-III nitride semiconductor laser device 11 has a gain-guiding type structure, but embodiments of the present invention are not limited to the gain-guiding type structure. The group-III nitride semiconductor laser device 11 has a laser structure 13 and an electrode 15. The laser structure 13 includes a support base 17 and a semiconductor region 19. The support base 17 comprises a hexagonal group-III nitride semiconductor and has a semipolar principal surface 17a and a back surface 17b. The semiconductor region 19 is provided on the semipolar principal surface 17a of the support base 17. The electrode 15 is provided on the semiconductor region 19 of the laser structure 13. The semiconductor region 19 includes a first cladding layer 21, a second cladding layer 23 and an active layer 25. The first cladding layer 21 comprises a first conductivity type gallium nitride based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes gallium nitride based semiconductor layers, and the gallium nitride based semiconductor layers are, for example, well layers 25a. The active layer 25 includes barrier layers 25b of a gallium nitride based semiconductor, and the well layers 25a and the barrier layers 25b are alternately arranged. The well layers 25a comprise, for example, of InGaN or the like and the barrier layers 25b, for example, GaN, InGaN, or the like. The active layer 25 can include a quantum well structure provided so as to generate light at the wavelength of not less than 360 nm and not more than 600 nm, and making use of the semipolar surface is suitably applicable to generation of light at the wavelength of not less than 430 nm and not more than 550 nm. The first cladding layer 21, the second cladding layer 23, and the active layer 25 are arranged along an axis NX normal to the semipolar principal surface 17a. In the group-III nitride semiconductor laser device 11, the laser structure 13 includes a first fractured face 27 and a second fractured face 29, which intersect with an m-n plane defined by the normal axis NX and the m-axis of the hexagonal group-III nitride semiconductor.

Referring to FIG. 1, an orthogonal coordinate system S and a crystal coordinate system CR are depicted. The normal axis NX is directed along a direction of the Z-axis of the orthogonal coordinate system S. The semipolar principal surface 17a extends in parallel with a predetermined plane defined by the X-axis and the Y-axis of the orthogonal coordinate system S. In FIG. 1, a typical c-plane Sc is also depicted. The c-axis of the hexagonal group-III nitride semiconductor of the support base 17 tilts at an angle ALPHA with respect to the normal axis NX toward the m-axis of the hexagonal group-III nitride semiconductor.

The group-III nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 comprises a hexagonal group-III nitride semiconductor. The insulating film 31 has an opening 31a, and the opening 31a extends in a direction of an intersecting line LIX between the surface 19a of the semiconductor region 19 and the foregoing m-n plane, and has, for example, a stripe shape. The electrode 15 is in contact with the surface 19a of the semiconductor region 19 (e.g., a contact layer 33 of the second conductivity type) through the opening 31a, and extends in the direction of the foregoing intersecting line LIX. In the group-III nitride semiconductor laser device 11, a laser waveguide includes the first cladding layer 21, the second cladding layer 23 and the active layer 25, and extends in the direction of the foregoing intersecting line LIX.

In the group-III nitride semiconductor laser device 11, the first fractured face 27 and the second fractured face 29 intersect with the m-n plane defined by the m-axis of the hexagonal group-III nitride semiconductor and the normal axis NX. A laser cavity of the group-III nitride semiconductor laser device 11 includes the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The first and second fractured faces 27, 29 extend from an edge 13c of the first surface 13a to an edge 13d of the second surface 13b. The first and second fractured faces 27, 29 are different from the conventional cleaved facets like c-planes, m-planes, or a-planes.

In this group-III nitride semiconductor laser device 11, the first and second fractured faces 27, 29 that form the laser cavity intersect with the m-n plane. This allows for provision of the laser waveguide extending in the direction of the intersecting line between the m-n plane and the semipolar surface 17a. For this reason, the group-III nitride semiconductor laser device 11 has the laser cavity enabling a low threshold current.

The group-III nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, of GaN, InGaN, or the like. The p-side optical guide layer 37 includes a first portion 37a and a second portion 37b, and the p-side optical guide layer 37 comprises, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

The laser structure 13 has, at one end of the first fractured face 27, a scribed mark SM1 extending from the edge 13c of surface 11a of the group-III nitride semiconductor laser device 11 to the edge 13d of back surface 11b of the group-III nitride semiconductor laser device 11, and has, at the other end of the first fractured face 27, a scribed mark SM2 extending from the edge 13c of the surface 11a of the group-III nitride semiconductor laser device 11 to the edge 13d of the back surface 11b. Furthermore, the laser structure 13 also has scribed marks SM3, SM4 similarly on the second fractured face 29 side. The scribed marks SM1, SM2, SM3, SM4 have a depressed shape extending from the surface 11a to the back surface 11b of the group-III nitride semiconductor laser device 11. The scribed marks SM1, SM2, SM3, SM4 each are provided at ends (ends intersecting with the m-n plane) of the laser structure 13 and extend along a plane defined by the normal axis NX and the a-axis of the hexagonal group-III nitride semiconductor. The foregoing ends of the laser structure 13 (ends intersecting with the m-n plane) include one having the first fractured face 27 and one having the second fractured face 29. The first fractured face 27 is a face connecting respective edges 13e and 13f of the scribed marks SM1 and SM2 and the respective edges 13c and 13d of the surface 11a and the back surface 11b, and the second fractured face 29 is a face connecting respective edges of the scribed marks SM3 and SM4 and the respective edges 13c and 13d of the surface 11a and the back surface 11b. Since the first and second fractured faces 27, 29 are provided along the scribed mark SM1 or the like of the depressed shape extending from the surface 11a to the back surface 11b of the group-III nitride semiconductor laser device 11 as described above, the fractured faces are expected to have sufficient perpendicularity and flatness, and the first and second fractured faces 27, 29 can have the perpendicularity and flatness enough for laser cavity mirrors.

Figure 3:
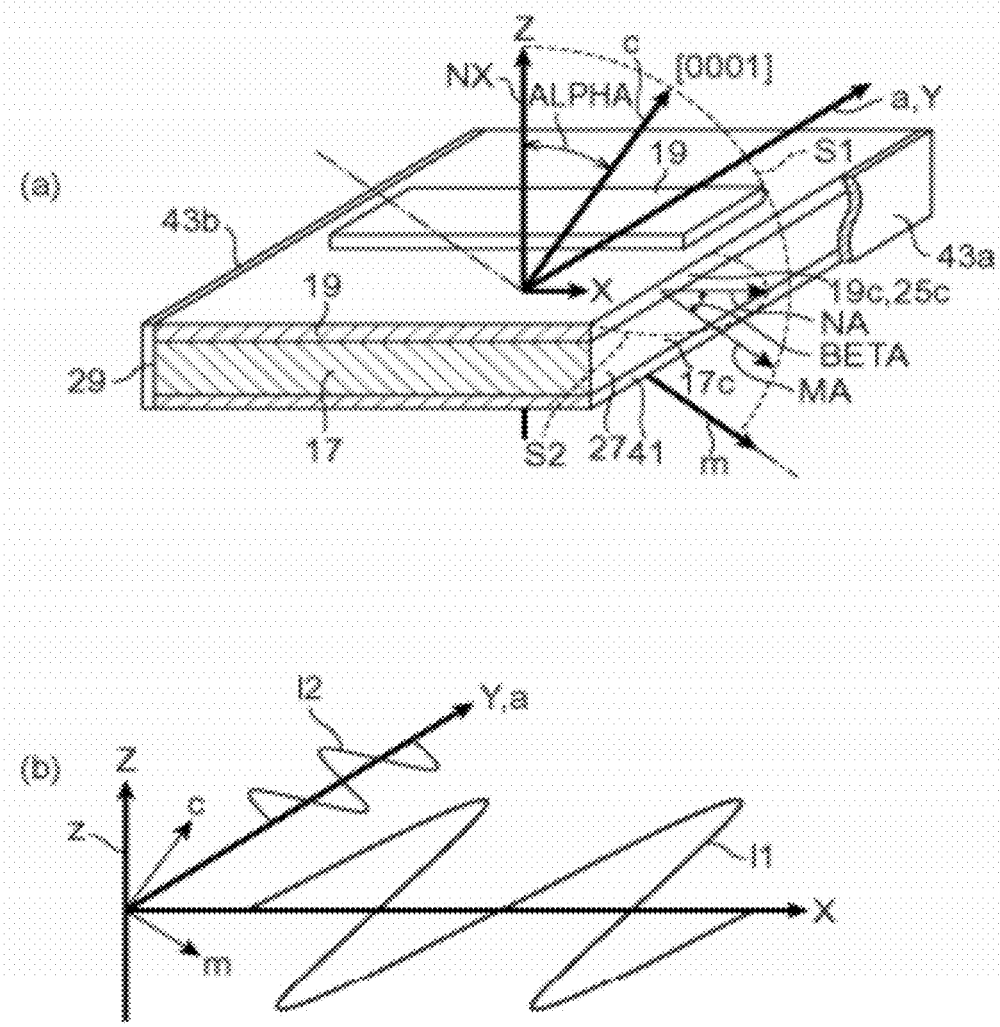
FIG. 3 is a drawing showing polarization of emission in the active layer of the group-III nitride semiconductor laser device.
Figure 4:
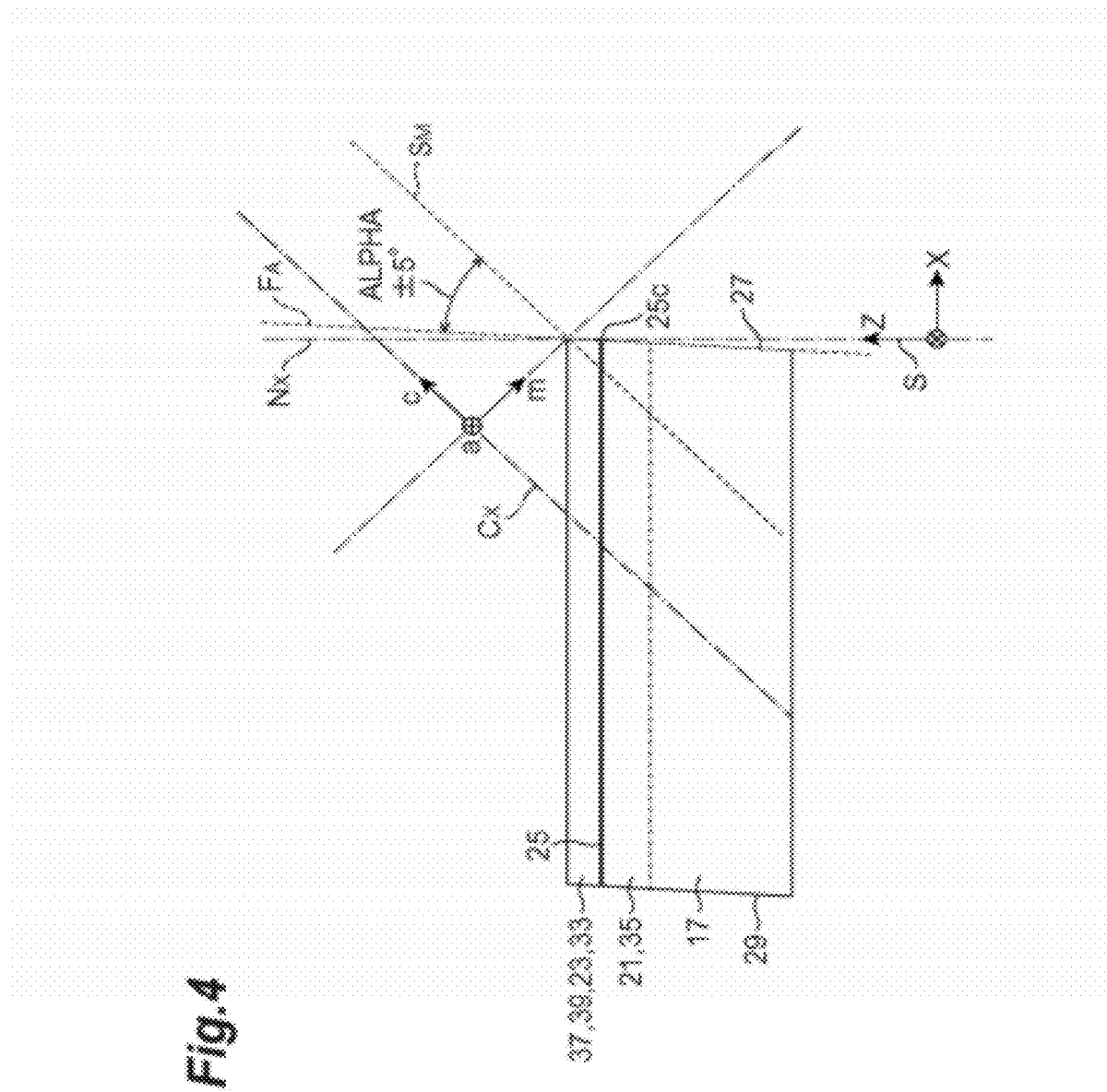
FIG. 4 is a drawing showing a relation between an end face of the group-III nitride semiconductor laser device and an m-plane of the active layer.

FIG. 2 is a drawing showing a band structure in the active layer in the group-III nitride semiconductor laser device. FIG. 3 is a drawing showing polarization of emission from the active layer 25 of the group-III nitride semiconductor laser device 11. FIG. 4 is a schematic cross sectional view taken along a plane defined by the c-axis and the m-axis. With reference to Part (a) of FIG. 2, three possible transitions between the conduction band and valence bands in the vicinity of Γ point of the band structure BAND are shown. The energy difference between band A and band B is relatively small. An emission by transition Ea between the conduction band and band A is polarized in the a-axis direction, and an emission by transition Eb between the conduction band and band B is polarized in a direction of the c-axis projected onto the principal surface. Concerning lasing, a threshold of transition Ea is smaller than a threshold of transition Eb.

With reference to Part (b) of FIG. 2, there are shown spectra of light in the LED mode in the group-III nitride semiconductor laser device 11. The light in the LED mode includes a polarization component I1 in the direction of the a-axis of the hexagonal group-III nitride semiconductor, and a polarization component I2 in the direction of the projected c-axis of the hexagonal group-III nitride semiconductor onto the principal surface, and the polarization component I1 is larger than the polarization component I2. Degree of polarization ρ is defined by (I1−I2)/(I1+I2). The laser cavity of the group-III nitride semiconductor laser device 11 enables the device to emit a laser beam in the mode that has large emission intensity in the LED mode.

As shown in FIG. 3, the device may be further provided with dielectric multilayer film 43a, 43b on at least one of the first and second fractured faces 27, 29 or on the respective faces. An end face coating is also applicable to the first and second fractured faces 27, 29. The end face coating allows adjustment of their reflectance.

As shown in Part (b) of FIG. 3, the laser light L from the active layer 25 is polarized in the direction of the a-axis of the hexagonal group-III nitride semiconductor. In this group-III nitride semiconductor laser device 11, a band transition allowing for implementation of a low threshold current has polarized nature. The first and second fractured faces 27, 29 for the laser cavity are different from the conventional cleaved facets like c-planes, m-planes, or a-planes. But, the first and second fractured faces 27, 29 have flatness and perpendicularity as mirrors for lasing cavity. For this reason, by using the first and second fractured faces 27, 29 and the laser waveguide extending between these first and second fractured faces 27, 29, as shown in Part (b) of FIG. 3, it becomes feasible to achieve low-threshold lasing through the use of the emission by transition Ea stronger than the emission by transition Eb that is polarized in the direction indicated by the c-axis projected onto the principal surface.

In the group-III nitride semiconductor laser device 11, an end face 17c of the support base 17 and an end face 19c of the semiconductor region 19 are exposed in each of the first and second fractured faces 27 and 29, and the end face 17c and the end face 19c are covered with the dielectric multilayer film 43a. An angle BETA between an m-axis vector MA of the active layer 25 and a vector NA normal to the end face 17c of the support base 17, and an end face 25c in the active layer 25 has a component $(BETA)_1$ defined on a first plane S1, which is defined by the c-axis and m-axis of the group-III nitride semiconductor, and a component $(BETA)_2$ defined on a second plane S2 (which is not shown but referred to as "S2" for easier understanding), which is perpendicular to the first plane S1 (which is not shown but referred to as "S1" for easier understanding) and the normal axis NX. The component $(BETA)_1$ is preferably in a range of not less than (ALPHA−5)° and not more than (ALPHA+5)° in the first plane S1 defined by the c-axis and m-axis of the group-III nitride semiconductor. This angular range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This group-III nitride semiconductor laser device 11 has the end faces in which the angle BETA taken from one of the c-axis and the m-axis to the other satisfies the aforementioned perpendicularity. The component $(BETA)_2$ is preferably in a range of not less than −5° and not more than +5° on the second plane S2. Here, $BETA^2 = (BETA)_1^2 + (BETA)_2^2$. The end faces (the first and second fractured faces 27 and 29) of the group-III nitride semiconductor laser device 11 satisfy the aforementioned perpendicularity as to the in-plane angle defined in the plane that is perpendicular to the normal axis NX to the semipolar principal surface 17a.

Referring again to FIG. 1, in the group-III nitride semiconductor laser device 11 the thickness DSUB of the support base 17 is preferably not less than 50 μm and not more than 150 μm. When the support base 17 of the group-III nitride semiconductor laser device 11 has this thickness, it becomes easier to form scribed through-holes (cf. below-described scribed through-holes 65a shown in FIG. 6) corresponding to the scribed marks SM, in a substrate product (below-described substrate product SP) including the group-III nitride semiconductor laser device 11. As described below, end faces (fractured faces) obtained through the use of the scribed through-holes are applicable as good laser cavity mirrors with sufficient perpendicularity and flatness. Therefore, the first and second fractured faces 27, 29 of the group-III nitride semiconductor laser device 11 can serve as good laser cavity mirrors.

In the group-III nitride semiconductor laser device 11, the angle ALPHA between the normal axis NX and the c-axis of the hexagonal group-III nitride semiconductor is preferably not less than 45° and preferably not more than 80°, and the angle ALPHA is preferably not less than 100° and preferably not more than 135°. When the angle is in a range of less than 45° and in a range of more than 135°, the end faces made by press are highly likely to be comprised of m-planes. When the angle is in a range of more than 80° and less than 100°, it could result in failing to achieve desired flatness and perpendicularity.

In the group-III nitride semiconductor laser device 11, more preferably, the angle ALPHA between the normal axis NX and the c-axis of the hexagonal group-III nitride semiconductor is not less than 63° and not more than 80°. Furthermore, the angle ALPHA is particularly preferably not less than 100° and not more than 117°. When the angle is in a range of less than 63° and in a range of more than 117°, an m-plane can be formed in part of an end face made by press. When the angle is in a range of more than 80° and less than 100°, it could result in failing to achieve desired flatness and perpendicularity.

The semipolar principal surface 17a can be any one of {20-21} plane, {10-11} plane, {20-2-1} plane and {10-1-1} plane. Furthermore, a surface with a slight tilt in a range of not less than −4° and not more than +4° with respect to these planes may also be applied as the principal surface. On the semipolar principal surface 17a of one of these typical planes, it is feasible to provide the first and second end faces (the first and second fractured faces 27 and 29) with flatness and perpendicularity enough to construct the laser cavity of the group-III nitride semiconductor laser device 11. Furthermore, end faces with sufficient flatness and perpendicularity are obtained in an angular range across these typical plane orientations.

In the group-III nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The support base 17 can comprise any one of GaN, AN, AlGaN, InGaN, and InAlGaN. When the substrate of any one of these GaN-based semiconductors is used, the end faces (the first and second fractured faces 27 and 29) applicable to the cavity can be obtained. When an AlN or AlGaN substrate is used, it is feasible to increase the degree of polarization and to enhance optical confinement by virtue of low refractive index. When an InGaN substrate is used, it is feasible to decrease degree of the lattice mismatch between the substrate and the light emitting layer and to improve crystal quality.

Figure 5:
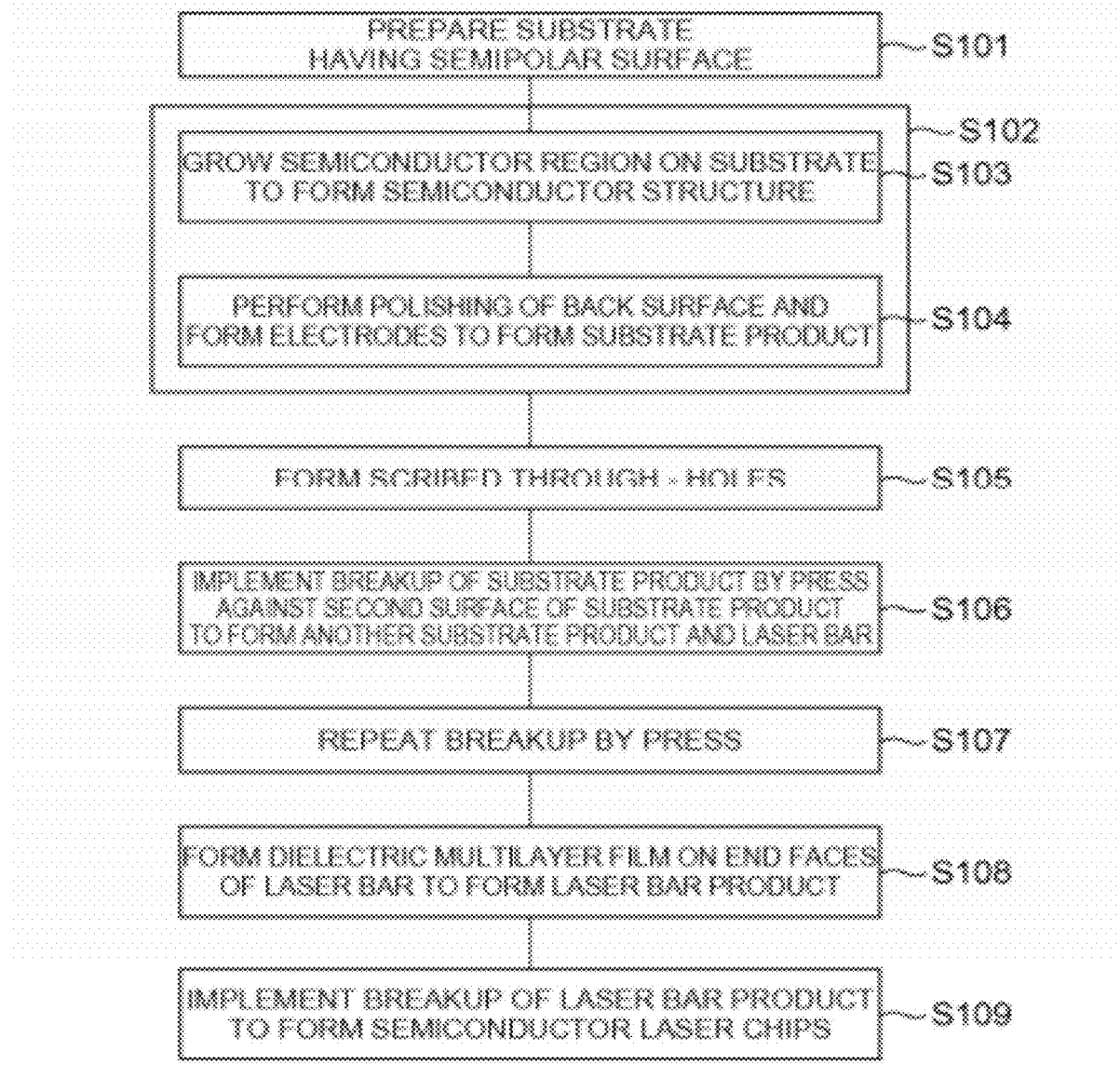
FIG. 5 is a flowchart showing major steps in a method of fabricating the group-III nitride semiconductor laser device according to the embodiment.

FIG. 5 is a drawing showing major steps in a method of fabricating the group-III nitride semiconductor laser device according to the present embodiment. With reference to Part (a) of FIG. 6, a substrate 51 is shown. In step S101, the substrate 51 is prepared for fabrication of the group-III nitride semiconductor laser device. The c-axis (vector VC) of the hexagonal group-III nitride semiconductor of the substrate 51 tilts at an angle ALPHA with respect to the normal axis NX toward the m-axis (vector VM) of the hexagonal group-III nitride semiconductor. Accordingly, the substrate 51 has a semipolar principal surface 51a of the hexagonal group-III nitride semiconductor.

In step S102, a substrate product SP is formed. In Part (a) of FIG. 6, the substrate product SP is depicted as a member of a nearly disklike shape, but the shape of the substrate product SP is not limited thereto. For obtaining the substrate product SP, step S103 is first performed to form a laser structure 55. The laser structure 55 includes a semiconductor region 53 and the substrate 51, and in step S103, the semiconductor region 53 is grown on the semipolar principal surface 51a. For forming the semiconductor region 53, a first conductivity type GaN-based semiconductor region 57, a light emitting layer 59, and a second conductivity type GaN-based semiconductor region 61 are grown sequentially on the semipolar principal surface 51a. The GaN-based semiconductor region 57 can include, for example, an n-type cladding layer and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The GaN-based semiconductor region 57, the light emitting layer 59, and the second conductivity type GaN-based semiconductor region 61 are arranged in the direction of the normal axis NX to the semipolar principal surface 51a. These semiconductor layers are epitaxially grown thereon. The surface of the semiconductor region 53 is covered with an insulating film 54. The insulating film 54 comprises, for example, of silicon oxide. The insulating film 54 has an opening 54a. The opening 54a has, for example, a stripe shape.

Step S104 is carried out to form an anode electrode 58a and a cathode electrode 58b on the laser structure 55. Before forming the electrode on the back surface of the substrate 51, the back surface of the substrate used in crystal growth is polished to form a substrate product SP in desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. After these steps, the substrate product SP is obtained. The substrate product SP includes a first surface 63a, and a second surface 63b located opposite thereto. The semiconductor region 53 is located between the first surface 63a and the substrate 51.

Figure 6:
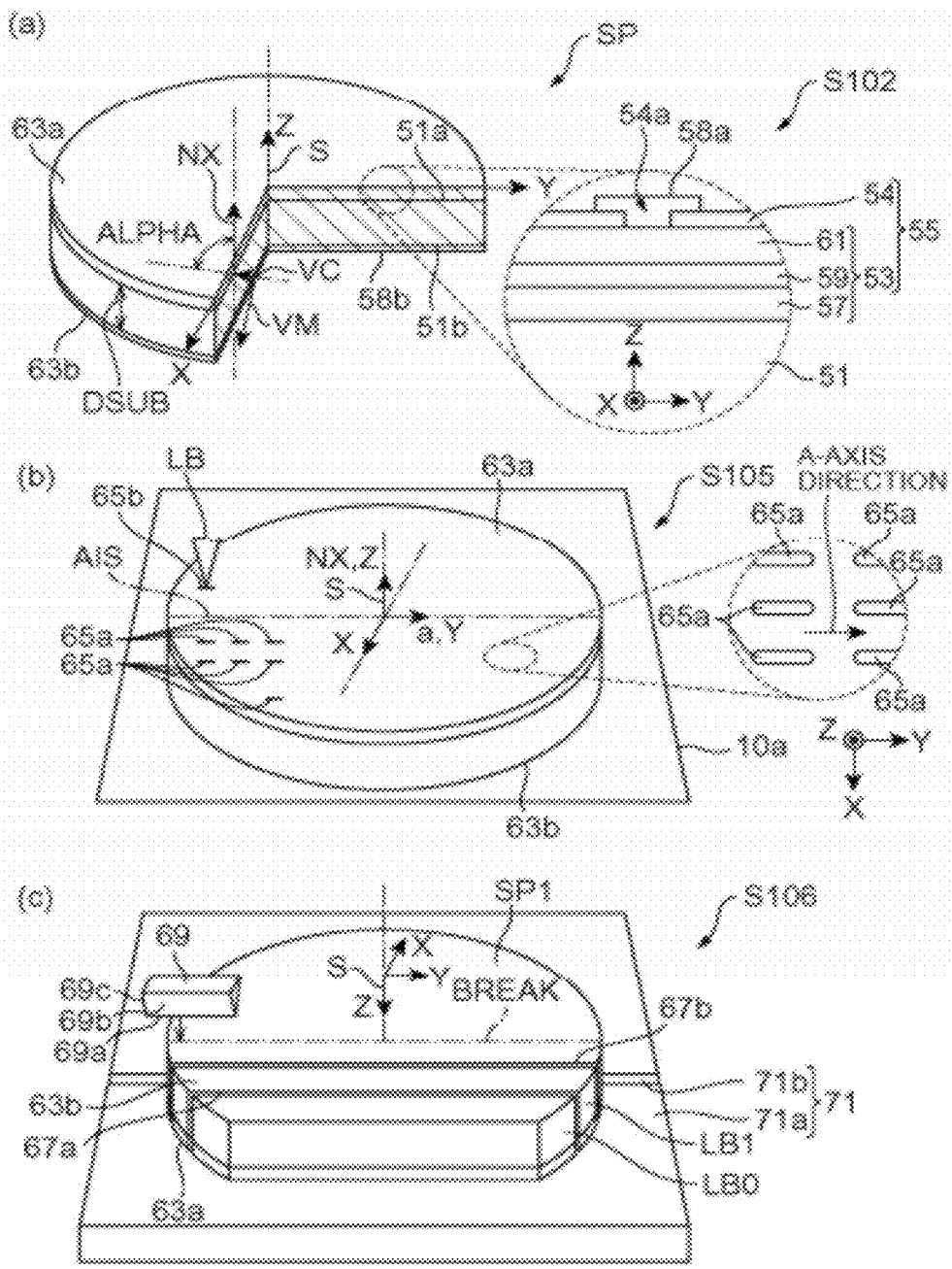
FIG. 6 is a drawing schematically showing major steps in the method of fabricating the group-III nitride semiconductor laser device according to the embodiment.

Step S105 is to scribe the first surface 63a of the substrate product SP, as shown in Part (b) of FIG. 6. This scribing is carried out using a laser scriber 10a. The scribing results in forming a plurality of scribed through-holes 65a. In Part (b) of FIG. 6, several scribed through-holes are already formed, and formation of a scribed through-hole 65b is in progress with a laser beam LB. The scribed through-holes 65a and the like are through-holes penetrating the substrate product SP from the first surface 63a to the second surface 63b thereof, and have a shape extending in the a-axis direction of the hexagonal group-III nitride semiconductor when viewed from the first surface 63a (or the second surface 63b). Namely, the width of the scribed through-holes 65a and the like in the a-axis direction of the hexagonal group-III nitride semiconductor is larger than the width thereof in the direction perpendicular to the a-axis direction of the hexagonal group-III nitride semiconductor. The width of the scribed through-holes 65a and the like in the a-axis direction of the hexagonal group-III nitride semiconductor can be, for example, not less than 50 μm and not more than 300 μm, and the width of the scribed through-holes 65a and the like in the direction perpendicular to the a-axis direction of the hexagonal group-III nitride semiconductor can be, for example, not less than 5 μm and not more than 15 μm.

The plurality of scribed through-holes 65a and the like are formed, for example, at the pitch of about 400 μm along the a-axis direction of the hexagonal group-III nitride semiconductor. A plurality of lines each including a plurality of scribed through-holes 65a formed along the a-axis direction of the hexagonal group-III nitride semiconductor are formed at a pitch of an approximately equal interval in the substrate product SP, along a plane defined by the c-axis and m-axis of the hexagonal group-III nitride semiconductor.

When the group-III nitride semiconductor laser device 11 is separated from the substrate product SP by primary and secondary breaks described below, the scribed through-holes 65a and the like become the scribed mark SM1 and others of the group-III nitride semiconductor laser device 11.

The length of the scribed through-holes 65a is shorter than the length of an intersecting line AIS between the first surface 63a and an a-n plane defined by the normal axis NX and the a-axis of the hexagonal group-III nitride semiconductor, and the laser beam LB is applied to a part of the intersecting line AIS. By the application with the laser beam LB, through-holes extending in the specific direction and reaching the semiconductor region are formed in the first surface 63a. The scribed through-holes 65a can be formed, for example, in an edge of the substrate product SP.

As shown in Part (c) of FIG. 6, step S106 is carried out to implement breakup of the substrate product SP by press against the second surface 63b of the substrate product SP, thereby forming a substrate product SP1 and a laser bar LB1. The press is carried out with a breaking device, such as, a blade 69. This breaking (primary break) for forming the laser bar LB1 is carried on along the y-axis direction. The blade 69 includes an edge 69a extending in one direction, and at least two blade faces 69b and 69c that are formed to define the edge 69a. The pressing onto the substrate product SP1 is carried out on a support device 71. The support device 71 includes a support table 71a and a recess 71b, and the recess 71b extends in one direction. The recess 71b is formed in the support table 71a. The orientation and position of the scribed through-hole 65a of the substrate product SP1 are aligned with the extending direction of the recess 71b of the support device 71 to position the substrate product SP1 to the recess 71b on the support device 71. The orientation of the edge of the breaking device is aligned with the extending direction of the recess 71b, and the edge of the breaking device is pressed against the substrate product SP1 from a direction intersecting with the second surface 63b. The intersecting direction is preferably an approximately vertical direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to mirrors for the laser cavity of the semiconductor laser.

The laser bar LB1 thus formed has the first and second end faces 67a, 67b formed by the aforementioned breakup, and each of the end faces 67a, 67b extends from the first surface 63a to the second surface 63b. The end faces 67a, 67b form the laser cavity of the group-III nitride semiconductor laser device, and intersect with the XZ plane. This XZ plane corresponds to the m-n plane defined by the normal axis NX and the m-axis of the hexagonal group-III nitride semiconductor.

By use of this method, the first surface 63a of the substrate product SP is scribed in the direction of the a-axis of the hexagonal group-III nitride semiconductor, and thereafter the breakup of the substrate product SP is carried out by press against the second surface 63b of the substrate product SP, thereby forming the new substrate product SP1 and the laser bar LB1. This method allows the formation of the first and second end faces 67a, 67b, which intersect with the m-n plane, in the laser bar LB1. This end face forming method provides the first and second end faces 67a, 67b with flatness and perpendicularity enough to construct the laser cavity of the group-III nitride semiconductor laser device.

In this method, the laser waveguide thus formed extends in the direction of inclination of the c-axis of the hexagonal group-III nitride. The end faces of the laser cavity mirror allowing for provision of this laser waveguide are formed without use of dry-etching.

This method involves the fracturing of the substrate product SP1, thereby forming the new substrate product SP1 and the laser bar LB1. In Step S107, the breakup is repeatedly carried out by press to produce a number of laser bars. This fracture propagates along the scribed through-holes 65a shorter than a fracture line BREAK of the laser bar LB1.

In Step S108, dielectric multilayer films is formed on the end faces 67a, 67b of the laser bar LB1 to form a laser bar product. In Step S109, this laser bar product is separated into individual semiconductor laser dies (secondary break).

In the fabrication method according to the present embodiment, the angle ALPHA can be in a range of not less than 45° and not more than 80° and in a range of not less than 100° and not more than 135°. When the angle is in a range of less than 45° and in a range of more than 135°, the end face made by press becomes highly likely to be comprised of an m-plane. When the angle is in a range of more than 80° and less than 100°, it may result in failing to achieve desired flatness and perpendicularity. More preferably, the angle ALPHA can be in a range of not less than 63° and not more than 80° and in a range of not less than 100° and not more than 117°. When the angle is in a range of less than 45° and in a range of more than 135°, an m-plane can be formed in part of an end face formed by press. When the angle is in a range of more than 80° and less than 100°, it may result in failing to achieve desired flatness and perpendicularity. The semipolar principal surface 51a can be any one of {20-21} plane, {10-11} plane, {20-2-1} plane, and {10-1-1} plane. Furthermore, a surface slightly tilted in a range of not less than −4° and not more than +4° from the above planes is also used as the principal surface. On these typical semipolar surfaces, it is feasible to provide the end faces for the laser cavity with flatness and perpendicularity enough to construct the laser cavity of the group-III nitride semiconductor laser device.

The substrate 51 can be made of any one of GaN, AlN, AlGaN, InGaN, and InAlGaN. When any one of these GaN-based semiconductors is used for the substrate, it is feasible to obtain the end faces applicable to the laser cavity. The substrate 51 is preferably made of GaN.

In the step S104 of forming the substrate product SP, the semiconductor substrate used in crystal growth can be one subjected to processing such as slicing or grinding so that the substrate thickness becomes not less than 50 μm and not more than 150 μm, and having the second surface 63b of a processed surface formed by polishing. In this substrate thickness, it becomes easier to form the scribed through-holes 65a, and the end faces 67a, 67b can be formed in good yield, with flatness and perpendicularity enough to construct the laser cavity of the group-III nitride semiconductor laser device, or without ion damage.

In the production method of the laser end faces according to the present embodiment, the angle BETA explained with reference to FIG. 3 can be also defined in the laser bar LB1. In the laser bar LB1, the component $(BETA)_1$ of the angle BETA is preferably in a range of not less than $(ALPHA-5)°$ and not more than $(ALPHA+5)°$ on a first plane (plane corresponding to the first plane S1 in the description with reference to FIG. 3) defined by the c-axis and m-axis of the group-III nitride semiconductor. The end faces 67a, 67b of the laser bar LB1 satisfy the aforementioned perpendicularity as to the angle component of the angle BETA taken from one of the c-axis and the m-axis to the other. The component $(BETA)_2$ of the angle BETA is preferably in a range of not less than $-5°$ and not more than $+5°$ on a second plane (plane corresponding to the second plane S2 shown in FIG. 3). These end faces 67a, 67b of the laser bar LB1 also satisfy the aforementioned perpendicularity as to the angle component of the angle BETA defined on the plane perpendicular to the normal axis NX to the semipolar principal surface 51a.

The end faces 67a, 67b are formed by break by press against the plurality of GaN-based semiconductor layers epitaxially grown on the semipolar principal surface 51a. Since they are epitaxial films on the semipolar principal surface 51a, each of the end faces 67a, 67b are not cleaved facets each having a low plane index like c-planes, m-planes, or a-planes which have been used heretofore for the conventional laser cavity mirrors. However, through the break of the stack of epitaxial films on the semipolar principal surface 51a, the end faces 67a, 67b have flatness and perpendicularity applicable as laser cavity mirrors.

Figure 7:
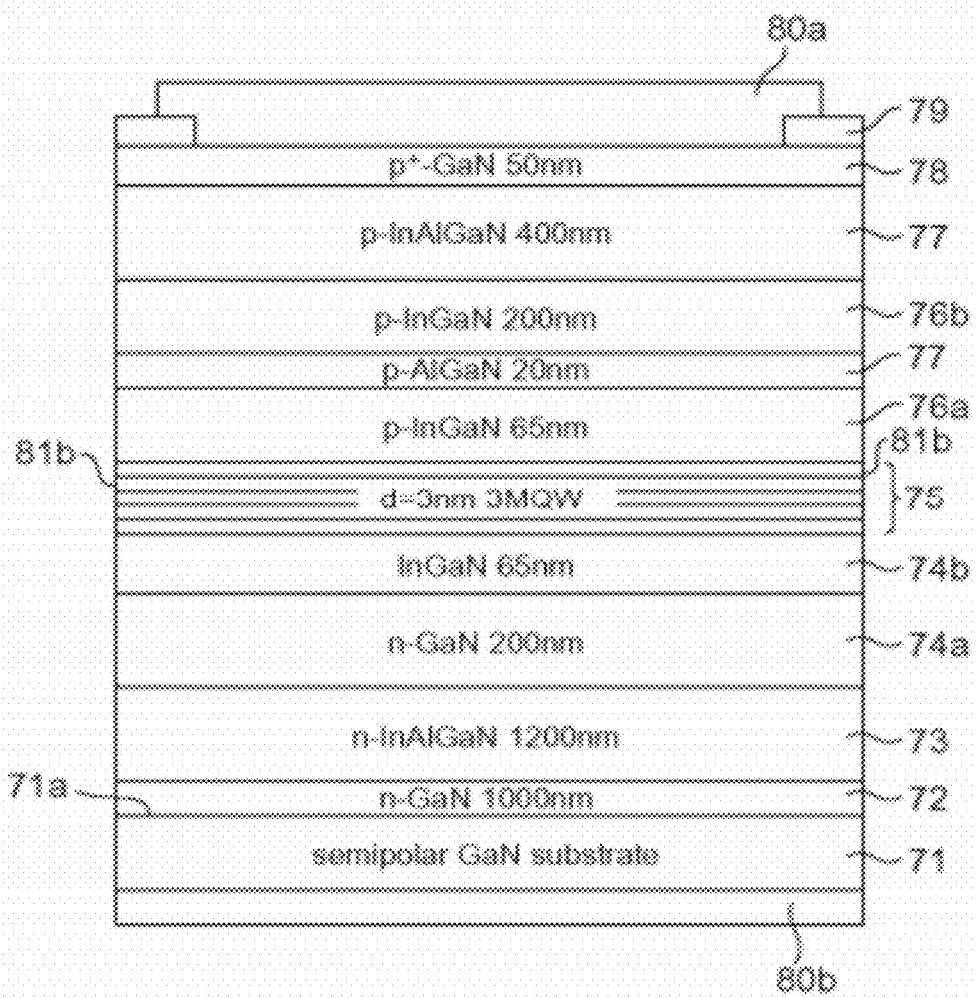
FIG. 7 is a drawing showing a structure of a laser diode shown in Example 1.

(Example) A laser diode shown in FIG. 7 is grown by organometallic vapor phase epitaxy as described below. The raw materials used are as follows: trimethyl gallium (TMGa); trimethyl aluminum (TMAl); trimethyl indium (TMIn); ammonia (NH₃); and silane (SiH₄). A substrate 71 is prepared. A GaN substrate is prepared as the substrate 71, and the GaN substrate is cut with a wafer slicing apparatus at an angle in a range of 0° to 90° to the m-axis from a (0001) GaN ingot thickly grown by HYPE, in such a manner that the angle ALPHA of the c-axis tilted toward the m-axis has a desired off angle in a range of 0° to 90°. For example, when the substrate is formed by cutting at the angle of 75°, the resultant substrate is prepared as a GaN substrate having a {20-21}-plane.

Before the growth, the substrate is observed by the cathodoluminescence method in order to estimate the stacking fault density of the substrate. In the cathodoluminescence, an emission process of carriers excited by an electron beam is observed and in a stacking fault, non-radiative recombination of carriers occurs in the vicinity thereof, so that the stacking fault is expected be observed as a dark line. The stacking fault density is defined as a density (line density) per unit length of dark lines observed. The cathodoluminescence method of nondestructive measurement is applied herein in order to estimate the stacking fault density, but it is also possible to use destructive measurement, such as a transmission electron microscope. When a cross section of a sample is observed from the a-axis direction with the transmission electron microscope, a defect extending in the m-axis direction from the substrate toward the sample surface indicates a stacking fault contained in the support base, and the line density of stacking faults can be determined in the same manner as in the cathodoluminescence method.

The above substrate 71 is placed on a susceptor in a reactor, and the epitaxial layers are grown in the following growth procedure. First, an n-type GaN 72 is grown thereon and its the thickness is 1000 nm. Next, an n-type InAlGaN cladding layer 73 is grown thereon and its thickness is 1200 nm. Thereafter, an n-type GaN guide layer 74a and an undoped InGaN guide layer 74b are grown, their thickness are 200 nm and 65 nm, respectively, and then a three-cycle MQW 75 constituted by GaN 15 nm thick/InGaN 3 nm thick is grown thereon. Subsequently grown thereon are an p-type InGaN guide layer 76a of the thickness of 65 nm, a p-type AlGaN block layer 77a of the thickness of 20 nm, and a p-type InGaN guide layer 76b of the thickness of 200 nm. Then, a p-type InAlGaN cladding layer 77b is grown thereon, and its thickness is 400 nm. Finally, a p-type GaN contact layer 78 is grown thereon and its thickness is 50 nm.

An insulating film 79 of $SiO_2$ is deposited on the contact layer 78 and then photolithography and wet etching processes are applied to form a stripe window having the width of 10 μm in the insulating film 79. In this step, a contact window is formed along a stripe direction which is an M-direction (direction of the contact window extending along the predetermined plane defined by the c-axis and the m-axis).

After the formation of the stripe window, a p-side electrode 80a of Ni/Au and a pad electrode of Ti/Al are made by vapor deposition. Next, the back surface of the GaN substrate (GaN wafer) is polished to 80 μm (or 60 μm) using diamond slurry to produce a substrate product with the mirror-polished back surface. Then, the thickness of the thus formed substrate product is measured with a contact film thickness meter. The measurement of substrate thickness may also be carried out with a microscope from the observation of a cross section of a prepared sample. The microscope applicable herein can be an optical microscope or a scanning electron microscope. An n-side electrode 80b of Ti/Al/Ti/Au is formed by vapor deposition on the back surface (polished surface) of the GaN substrate (GaN wafer).

The laser cavity mirrors for laser stripes are produced with a laser scriber that uses the YAG laser at the wavelength of 355 nm. When the break is implemented with the laser scriber, the laser chip yield can be improved as compared with break implemented using a diamond scriber. Methods (A) and (B) below are used as methods of forming the scribed through-holes 65a and the like extending from the first surface 63a to the second surface 63b of the substrate product SP:

|  | substrate thickness (μm), | laser output (mW), | laser scanning speed (mm/s); |
| --- | --- | --- | --- |
| method (A) | 80, | 250, | 1; |
| method (B) | 60, | 250, | 1 |

By method (C) below, instead of the scribed through-holes, scribed grooves SL1, SL2 (cf. FIG. 8 and others) are formed in the first surface 63a of the substrate product SP so as not to reach the second surface 63b. The scribed grooves SL1, SL2 are grooves formed in the first surface 63a without reaching the second surface 63b of the substrate product SP. A group-III nitride semiconductor laser device with the scribed grooves SL1, SL2 will be particularly referred to as group-III nitride semiconductor laser device 111.

|  | substrate thickness (μm), | laser output (mW), | laser scanning speed (mm/s); |
|---|---|---|---|
| method (C) | 80 | 100, | 5 |

The scribed through-holes and the scribed grooves are formed at the pitch of 400 μm by applying a laser beam directly onto the epitaxially grown surface through opening portions of the insulating film on the substrate. The laser cavity length is 600 μm. The scribed through-holes thus formed have, for example, the length of about 200 μm and the width of about 12 μm, and the scribed grooves have, for example, the length of about 200 μm, the width of about 8 μm, and the depth of about 40 μm.

The fractured faces made by break are observed with a scanning electron microscope, and no prominent unevenness is observed. From this result, the flatness (magnitude of unevenness) of the fractured faces can be not more than 20 nm. Furthermore, the perpendicularity of the fractured faces to the surface of the sample can be within a range of ±5°.

The end faces of the laser bar are coated with a dielectric multilayer film by vacuum vapor deposition. The dielectric multilayer film is composed of an alternate stack of $SiO_2$ and $TiO_2$. Each thickness thereof is adjusted in a range of 50 to 100 nm and is designed so that the center wavelength of reflectance falls within a range of 500 to 530 nm. The reflecting surface on one side has an alternate stack of ten cycles and a designed value of reflectance of about 95%, and the reflecting surface on the other side has an alternate stack of six cycles and a designed value of reflectance of about 80%.

The devices thus formed are energized to make their evaluation at room temperature. A pulsed power source is used as a power supply for the energization, and supplies pulses with the pulse width of 500 ns and the duty ratio of 0.1%, and the energization is implemented through probing needles that are in contact with the surface electrodes. In light output measurement, an emission from the end face of the laser bar is detected with a photodiode to obtain a current-light output characteristic (I-L characteristic). In measurement of emission wavelength, the emission from the end face of the laser bar is supplied through an optical fiber to a spectrum analyzer of a detector to measure a spectrum thereof. In estimation of a polarization, the emission from the laser bar is made to pass through a polarizing plate by rotation, thereby determining the polarization state. In observation of LED-mode emission, an optical fiber is aligned to the front surface side of the laser bar to measure optical emission from the front surface.

The polarization in the laser beam is measured for every laser device, and it is found that the laser beam is polarized in the a-axis direction. The laser wavelength is in a range of 500-530 nm.

Figure 8:
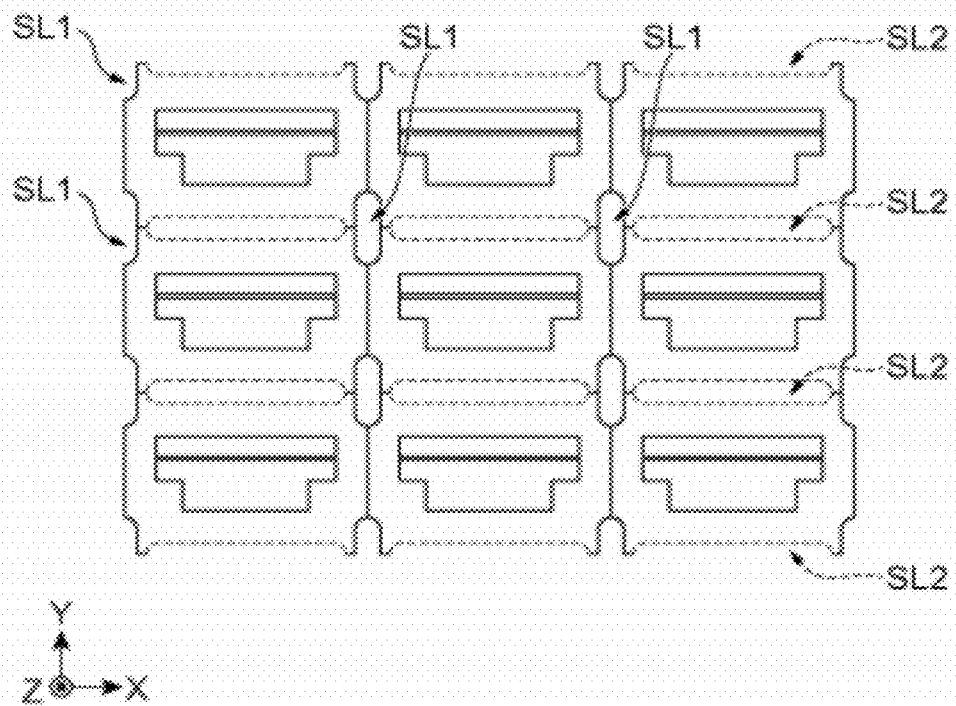
FIG. 8 is a drawing for explaining a conventional method of forming scribed grooves.

FIG. 8 is a schematic diagram of a substrate obtained by forming the scribed grooves in the substrate product SP by the method (C). In FIG. 8, for easier understanding, x-directional scribed grooves (scribed grooves SL2) for secondary break are also formed in addition to y-directional scribed grooves (scribed grooves SL1) for primary break, but in a practical process the scribed grooves SL2 for secondary break are formed after the primary break.

Figure 9:
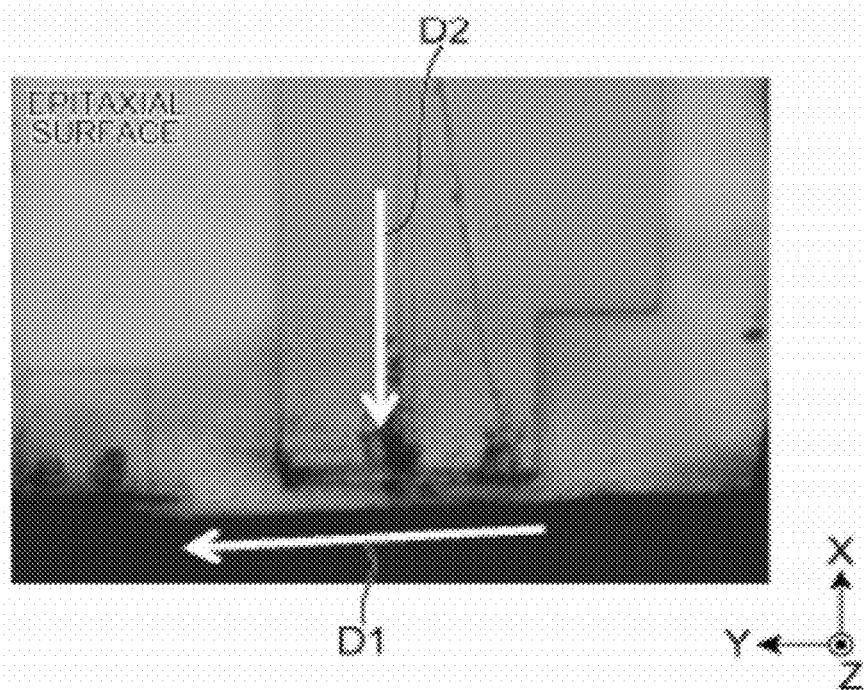
FIG. 9 is a drawing showing a shape of an end face formed by the conventional method of forming scribed grooves, as a view from an epitaxially grown surface.

FIG. 9 shows the observation result in observation with an optical microscope of an epitaxially grown surface of a semipolar-plane LD (group-III nitride semiconductor laser device 111) fabricated as a chip through the primary and secondary breaks. In FIG. 9, the break proceeding direction is the y-direction. It is seen from FIG. 9 that a fissure by break (denoted by symbol D1 in the drawing) develops so as to turn from the direction (y-direction) perpendicular to the waveguide, to the direction of the c-axis (projected direction D2 of the c-axis on the epitaxially grown surface, which corresponds to the −x direction). As a result, the laser cavity mirrors perpendicular to the waveguide are not obtained, and it is expected that they will cause decrease in lasing yield and increase in lasing threshold current. As described above, the quality of the laser cavity mirrors can become unstable by the technology of forming the scribed grooves SL1, SL2 by the method (C).

Figure 10:
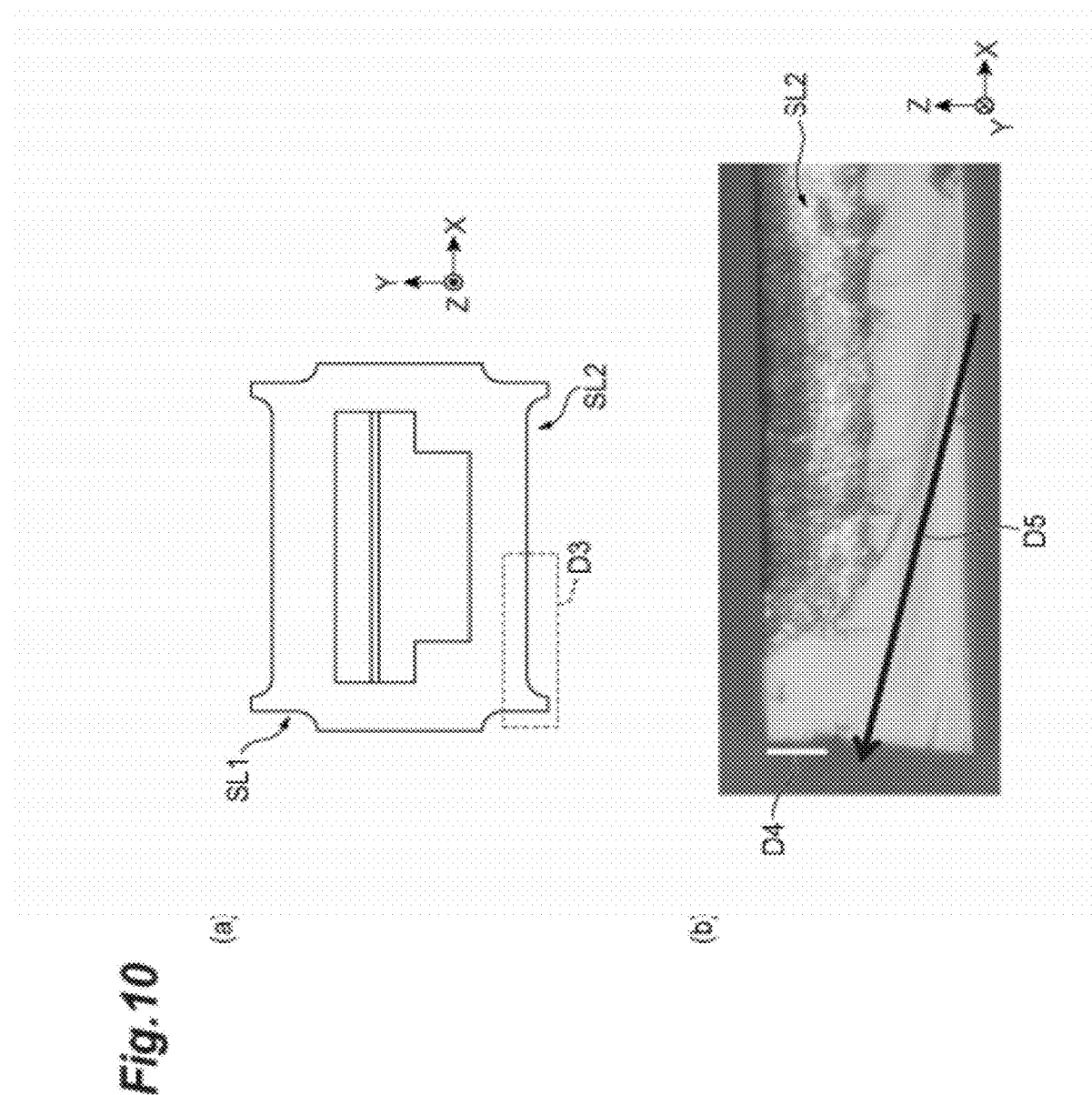
FIG. 10 is a drawing showing a shape of an end face of a group-III nitride semiconductor laser device formed by the conventional method of forming scribed grooves, as a view from a side surface.

FIG. 10 shows the result of observation of an end face (z-x cross section) of this semipolar-plane LD (group-III nitride semiconductor laser device 111). Part (a) of FIG. 10 is a view of the epitaxially grown surface of the group-III nitride semiconductor laser device 111, and Part (b) of FIG. 10 is a view of a side surface of the group-III nitride semiconductor laser device 111 in a region D3 shown in Part (a) of FIG. 10. It is seen from FIG. 10 that during development of a fissure in the depth direction (−z direction) from the scribed groove SL1, the fissure develops, not in a direction D4 parallel to the depth direction of the scribed groove SL1, but in the direction perpendicular to the c-axis (direction indicated by symbol D5 in the drawing). Namely, a c-plane appears below the scribed groove SL1. It is easily presumed that an end face fault is caused by the appearance of a cleaved facet with a low index below the scribed groove SL1 during the formation of the laser cavity mirrors of the semipolar-plane LD (group-III nitride semiconductor laser device 111) with the waveguide along the off direction as described above.

Figure 11:
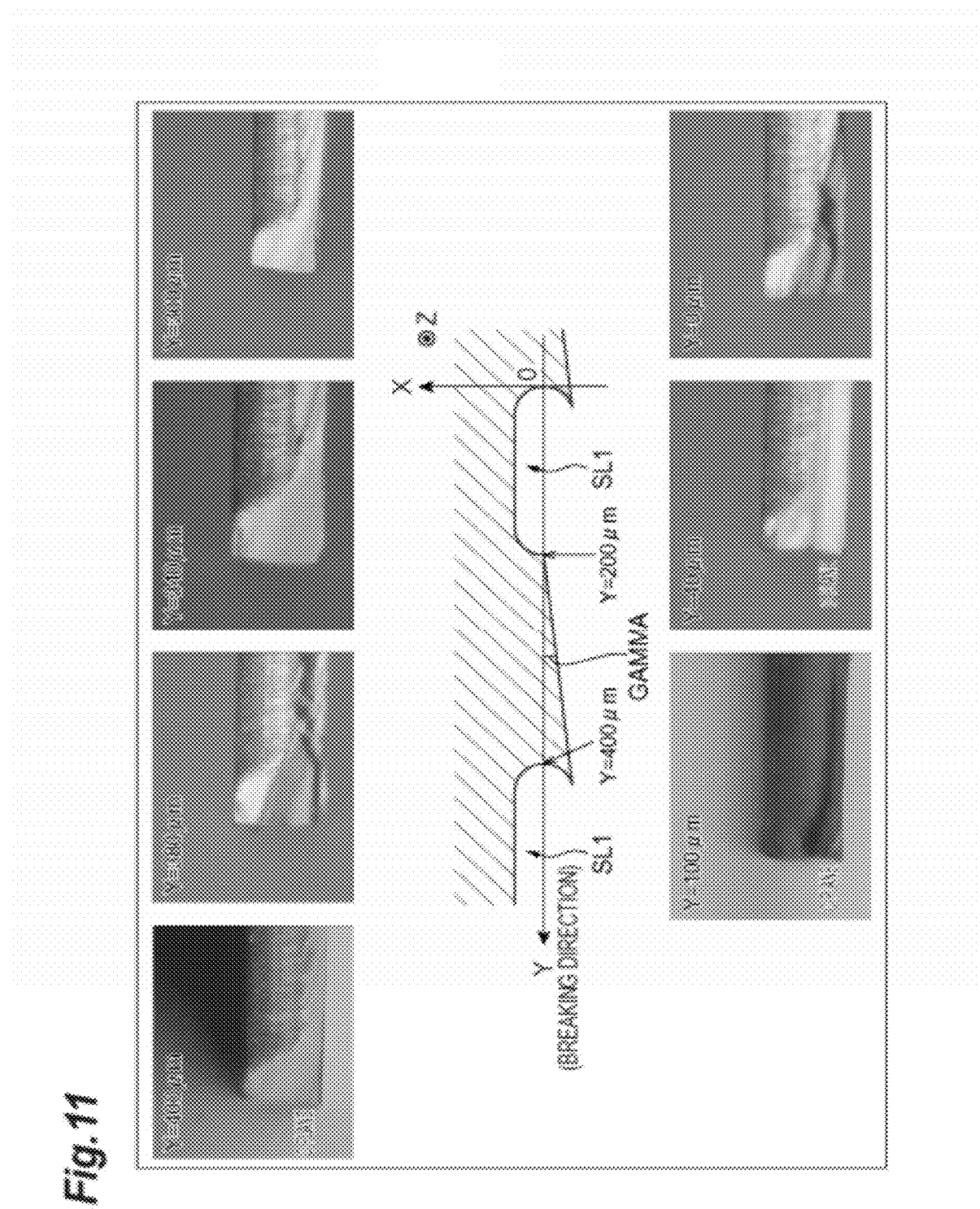
FIG. 11 is a drawing for explaining a shape of an end face of a group-III nitride semiconductor laser device formed from the conventional scribed grooves.

FIG. 11 shows the result of observation to observe how appearances of the end face in the depth direction vary with development of a fissure in the direction (y-direction) perpendicular to the waveguide. In the region where the scribed groove SL1 is formed, as described above, the end face is composed of two planes, the plane relatively perpendicular to the epitaxially grown surface, which is made by scribing, and the c-plane appearing below the scribed groove SL1, and has an edge as an intersecting line between the two planes. As shown in FIG. 11, when the fissure develops in the y-direction to reach a region where no scribed groove is formed (200 μm<y<400 μm in FIG. 11), the aforementioned two planes constituting the end face gradually come to connect smoothly so as to eliminate the edge. As a result, the end face becomes a curved surface.

Figure 12:
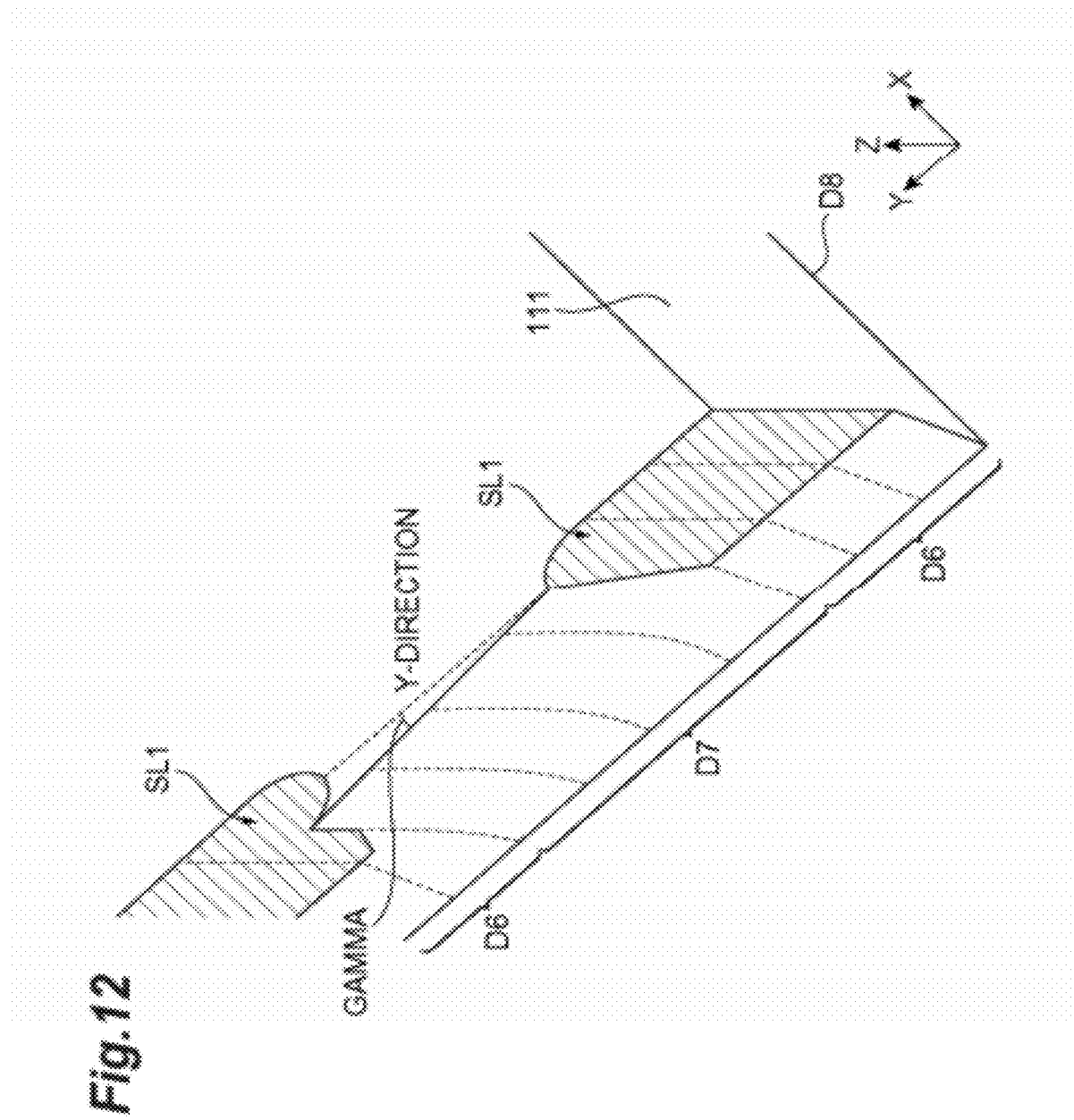
FIG. 12 is a drawing for explaining a process of forming an end face of a laser bar produced using the conventional scribed grooves.

The inventor interpreted the mechanism of development of fissure as shown in FIG. 12, based on the result shown in FIG. 11. According to Inventor's knowledge, it is found that the press with the blade makes a straight edge on the surface against which the blade is urged during the break (on the substrate back surface D8 side). As described above, the c-plane appears on the back surface D8 side (regions indicated by symbol D6 in the drawing) below the scribed grooves. In a region indicated by symbol D7 in the drawing, when the fissure reaches the region without the scribed groove (region indicated by symbol D7 in the drawing), the end face becomes curved, but the straight edge appears on the back side because of the press with the blade; therefore, the fissure appearing on the epitaxially grown surface develops while turning to the −x direction, as a result.

It is thus found that the cause of the failure in stably obtaining the laser cavity mirrors perpendicular to the waveguide in the case using the aforementioned method (C) is highly likely to be the c-plane appearing on the substrate back side below the scribed grooves SL1. Then the inventor consider that the laser cavity mirrors perpendicular to the waveguide could be stably obtained by suppressing the appearance of the c-plane on the substrate back side below the scribed grooves SL1, and discovered the aforementioned methods (A), (B) of forming the through-holes (scribed through-holes 65a and the like) penetrating the substrate product from the epitaxially grown surface to the substrate back surface with the laser scriber and performing the break.

Figure 13:
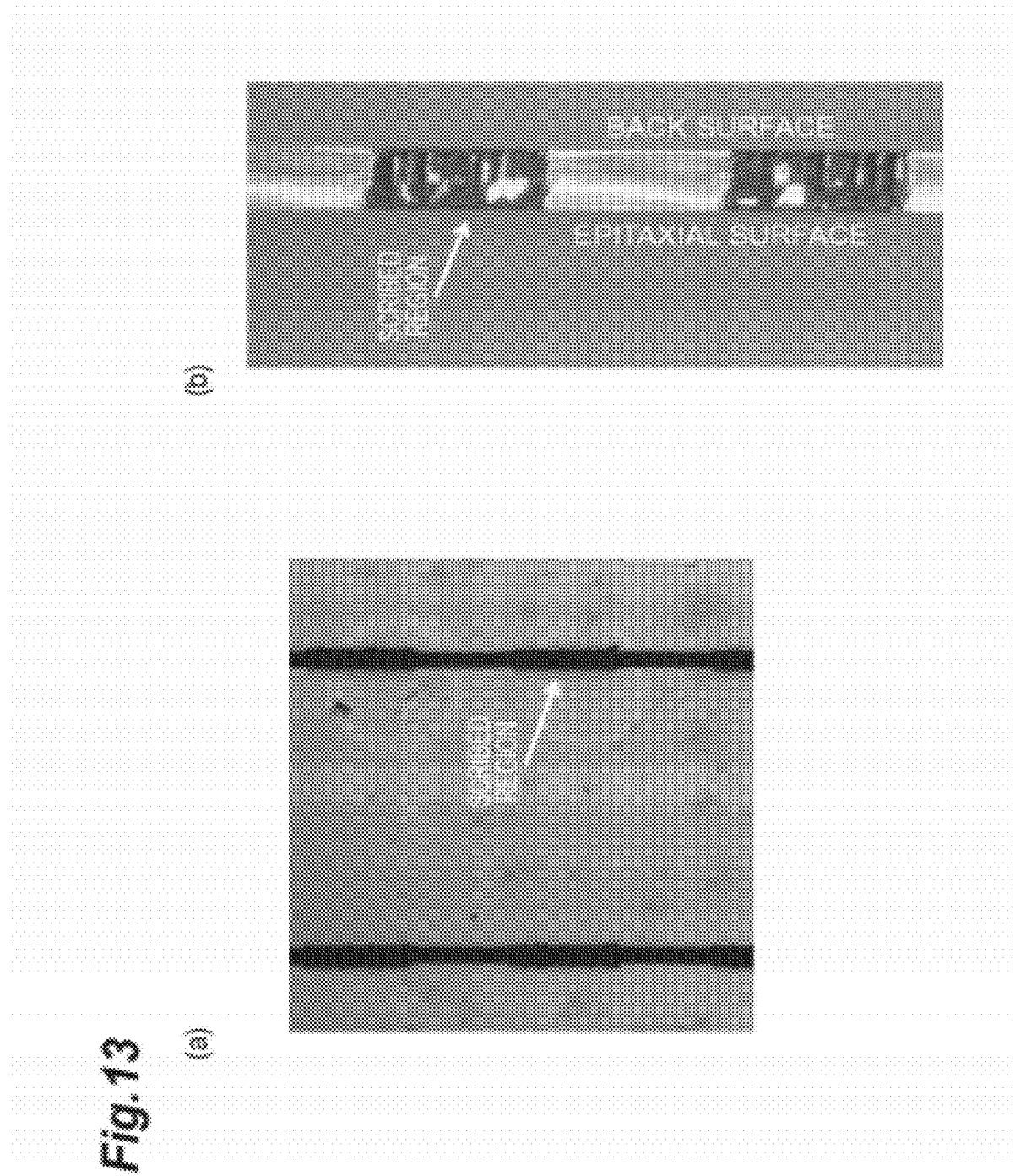
FIG. 13 is a drawing showing a shape of a scribed through-hole according to the embodiment.

In Part (a) of FIG. 13 and Part (b) of FIG. 13, optical microscope photographs of a sample (laser bar LB1 or the like) obtained by the method (A) are shown. In Part (a) of FIG. 13, the observation result from the epitaxially grown surface is shown. In Part (b) of FIG. 13, the observation result from the end face is shown. With reference to Part (a) of FIG. 13, the angular deviation of the laser cavity mirror from the direction perpendicular to the waveguide, as observed in FIG. 9, is not recognized. It is clear from Part (b) of FIG. 13 that through-holes are surely formed in this case. It is also confirmed that the through-holes (scribed through-holes 65a) are also formed in the method (B). Part (a) of FIG. 14 shows the observation result of an appearance of an end face near the waveguide of this sample (laser bar LB1 or the like). The end face is virtually perpendicular to the epitaxially grown surface, and is different from the conventional cleaved facets. For finding candidates for this end face, plane indices to make an angle near 90° to the (20-21) plane are determined by calculation. With reference to Part (b) of FIG. 14, the angles and plane indices below have angles near 90° to the (20-21) plane.

| specific plane index, | angle to {20-21} plane; |
|---|---|
| (−1016), | 92.46°; |
| (−1017), | 90.10°; |
| (−1018), | 88.29° |

It is considered that such a high-index plane is likely to be obtained as an end face, depending upon cleavage nature of each plane index and perpendicularity (about) ±5° of the laser during scribing.

Figure 15:
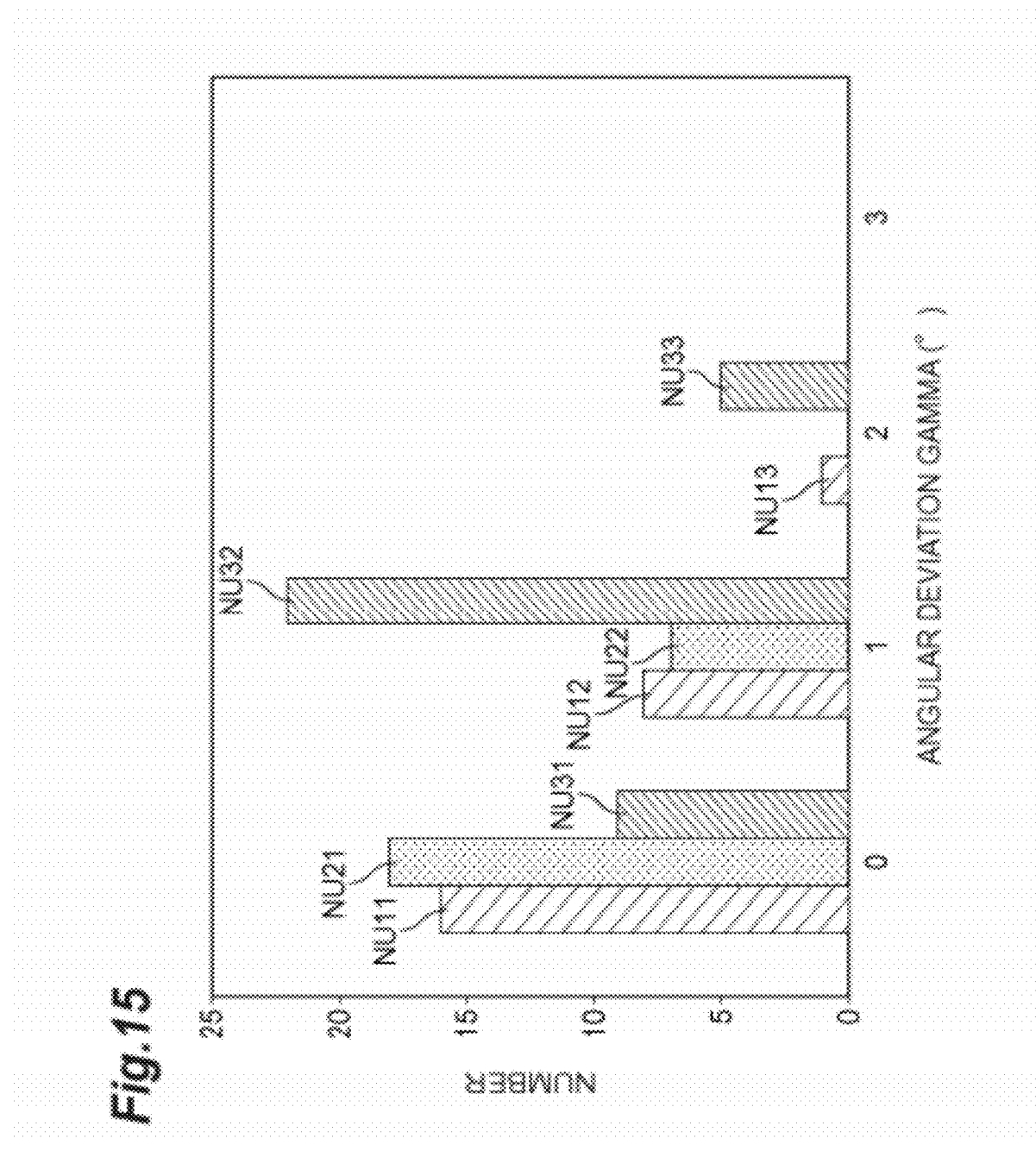
FIG. 15 is a drawing for comparison between the numbers of devices with angular deviation of end faces in the case using the conventional scribed grooves, and the numbers of devices with angular deviation of end faces in the case using the scribed through-holes according to the embodiment.

FIG. 15 shows the results of measurement of angular deviation GAMMA of the end face from the line in which the scribed through-holes (scribed grooves) are arrayed (the y-axis in FIG. 12), based on the observation results from the epitaxially grown surface of the samples (laser bars LB1 or the like) obtained by the methods (A) to (C). In FIG. 15, columns NU11, NU12, NU13 represent the results in the case where the scribed through-holes 65a are formed by the method (A); columns NU21, NU22 represent the results in the case where the scribed through-holes 65a are formed by the method (B); columns NU31, NU32, NU33 represent the results in the case where the scribed grooves SL1 or the like are formed by the method (C). It is confirmed by FIG. 15 that the angular deviation GAMMA is reduced in the samples (laser bars LB1 or the like) obtained by the methods of forming the scribed through-holes 65a or the like (method (A) and method (B)). The data shown in FIG. 15 is as described below.

| angular deviation GAMMA, | method (A), | method (B), | method (C); |
|---|---|---|---|
| 0 ≦ GAMMA ‹1, | 6, | 18, | 9; |
| 1 ≦ GAMMA ‹2, | 8, | 7, | 22; |
| 2 ≦ GAMMA ‹3, | 1, | 0, | 5; |
| 3 ≦ GAMMA ‹4, | 0, | 0, | 0 |

Averages and standard deviations of the angular deviations GAMMA in the respective methods (A) to (C) are as follows.

| | average, | standard deviation; |
|---|---|---|
| method (A), | 0.67, | 0.63; |
| method (B), | 0.63, | 0.57; |
| method (C), | 1.38, | 0.57 |

Figure 16:
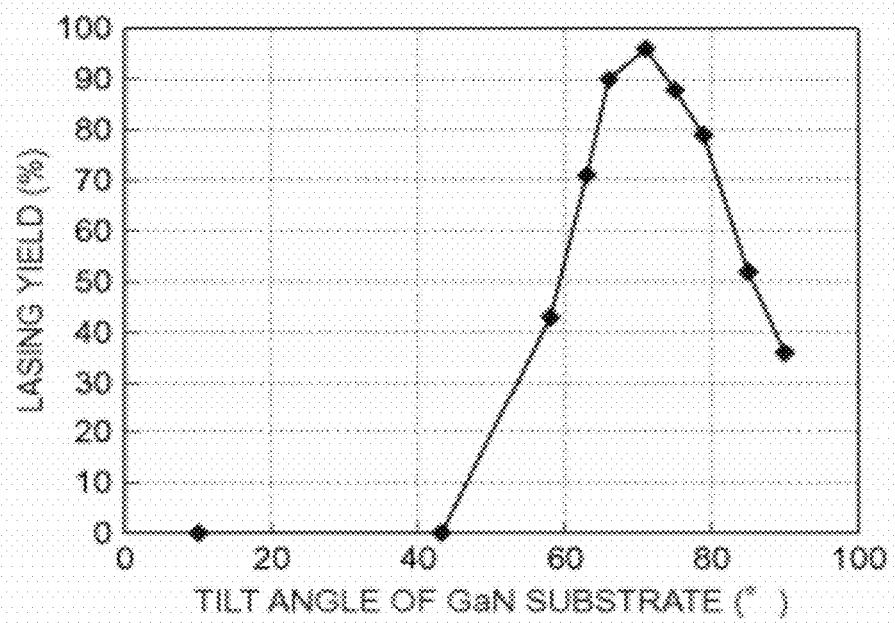
FIG. 16 is a drawing showing a relation of tilt angles of the c-axis toward the m-axis of GaN substrate versus lasing yield.

The relation of tilt angle of the c-axis toward the m-axis of GaN substrate (support base 17) of the group-III nitride semiconductor laser device 11 versus lasing yield is measured using the method (A). The result of this measurement is shown in FIG. 16. In the present example, the lasing yield is defined as (the number of laser chips)/(the number of measured chips). The measurement result shown in FIG. 16 is obtained using the GaN substrate with the stacking fault density of not more than $1\times10^4$ $(cm^{-1})$. It is seen from FIG. 16 that the lasing yield is extremely low with the off angles of not more than 45°. In this off angle region, when a fissure develops to reach a region without formation of a scribed through-hole 65a or the like (corresponding to the scribed mark SM1 or the like), an m-plane of strong cleavage nature is likely to appear, and it deteriorates the perpendicularity of the end face to the waveguide by the same mechanism as in FIG. 12. The lasing yield is considered to degrade as a result. From the above, the optimum off angle range of the GaN substrate (support base 17) is not less than 63° and not more than 80°. The same result is also obtained in a range of not less than 100° and not more than 117°, which is an angle range to provide crystallographically equivalent end faces. The data shown in FIG. 16 is as described below.

| tilt angle, | yield; |
|---|---|
| 10, | 0.1; |
| 43, | 0.1; |
| 58, | 43; |
| 63, | 71; |
| 66, | 90; |
| 71, | 96; |
| 75, | 88; |
| 79, | 79; |
| 85, | 52; |
| 90, | 36 |

Figure 17:
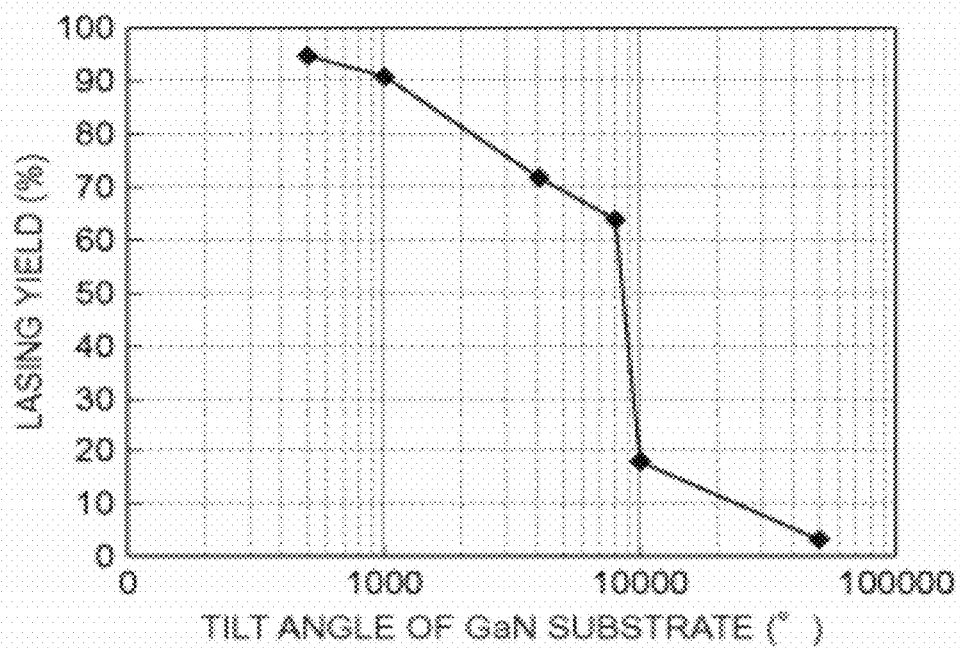
FIG. 17 is a drawing showing a relation of stacking fault density versus lasing yield.

The relation between stacking fault density and lasing yield is investigated using the method (A), and the result obtained is shown in FIG. 17. The definition of lasing yield is the same as above. It is seen from FIG. 17 that the lasing yield suddenly decreases with the stacking fault density of the GaN substrate (support base 17) over $1\times10^4$ $(cm^{-1})$. When the end face state is observed with an optical microscope, it is found that with samples having the decreased lasing yield, the unevenness of the end face is significant, and no flat end face is obtained. A conceivable reason for it is that there is a difference in easiness of fracture because of the existence of stacking faults. From the above, the stacking fault density in the GaN substrate (support base 17) needs to be not more than $1\times10^4$ $(cm^{-1})$. In the present example, the scribed through-holes 65a or the like reaching the back surface of the substrate are formed by applying the laser to the epitaxially grown surface (first surface 63a of substrate product SP) during the scribing, whereas it is confirmed with the optical microscope that damages and debris of the epitaxially grown surface are decreased by forming the scribed through-holes 65a or the like reaching the epitaxially grown surface by applying the laser to the back surface of the substrate (the second surface 63b of the substrate product SP). This method can improve the yield of LD (group-III nitride semiconductor laser device 11). The data shown in FIG. 17 is as described below.

| stacking fault density (cm$^{-1}$), | yield; |
|---|---|
| 500, | 95; |
| 1000, | 91; |
| 4000, | 72; |
| 8000, | 64; |
| 10000, | 18; |
| 50000, | 3 |

Figure 18:
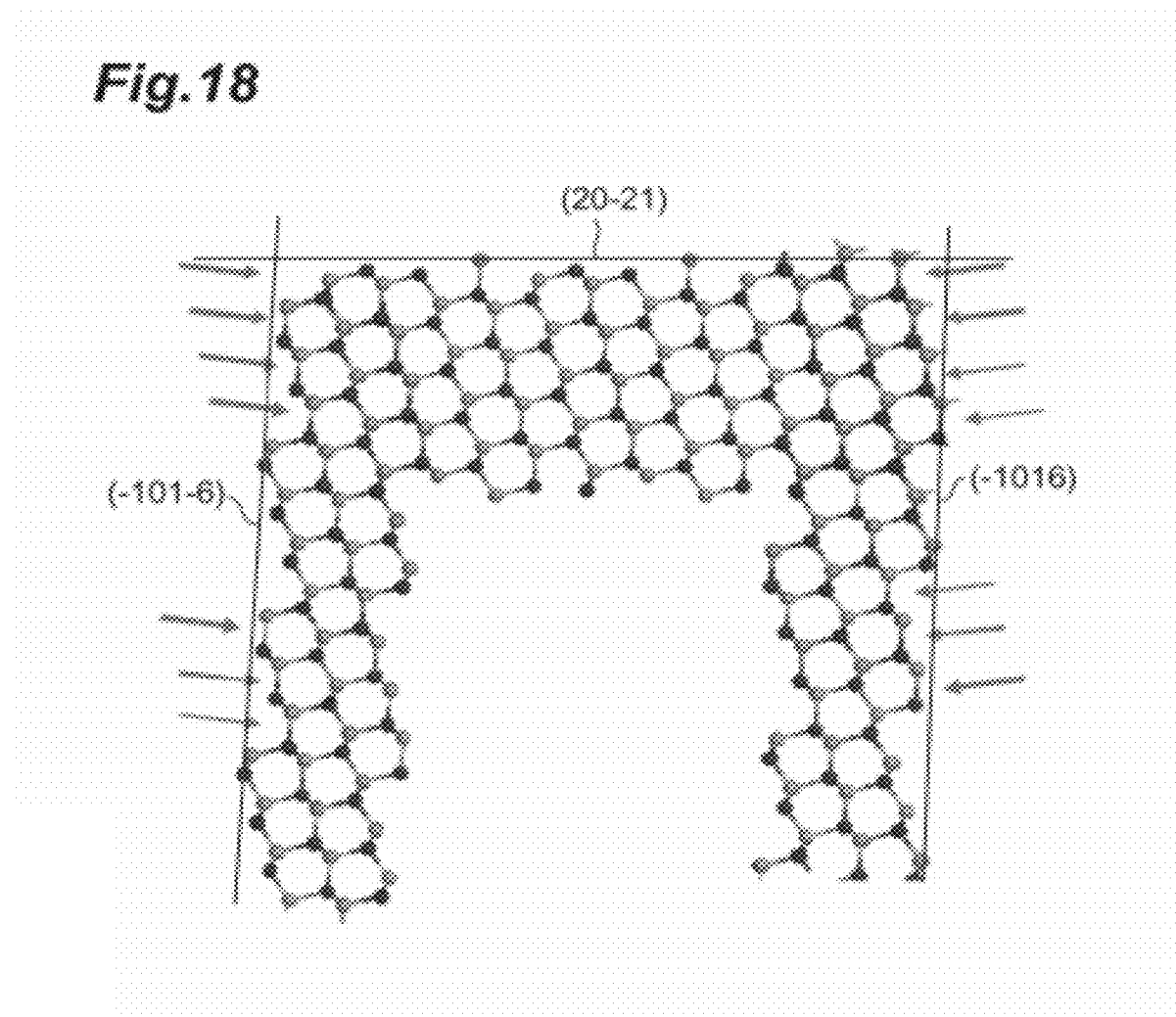
FIG. 18 is a drawing showing atomic arrangements in (20-21) plane, (-101-6) plane, and (-1016) plane.
Figure 19:
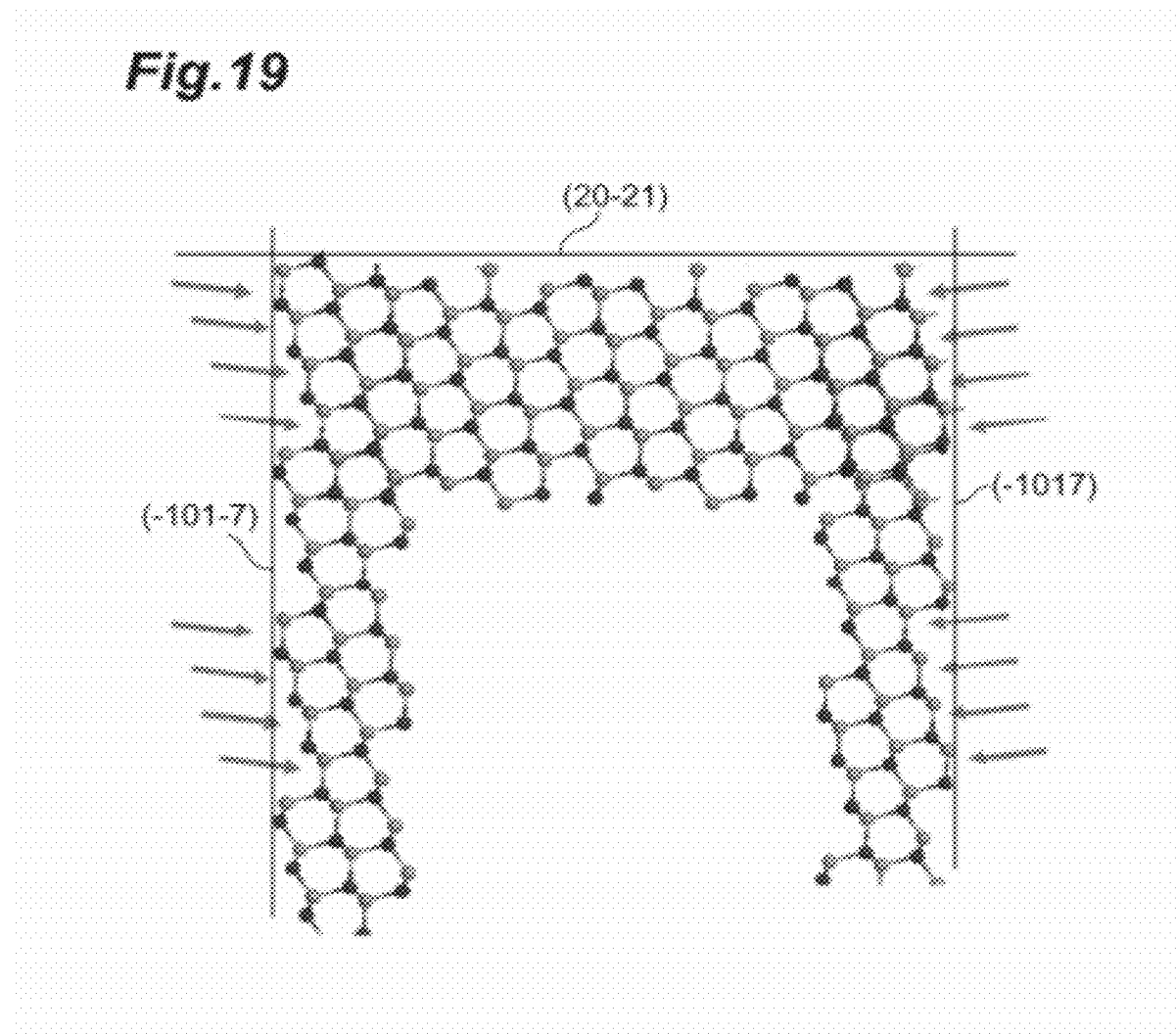
FIG. 19 is a drawing showing atomic arrangements in (20-21) plane, (-101-7) plane, and (-1017) plane.

FIG. 18 is a drawing showing atomic arrangements in the (20-21) plane, (-101-6) plane, and (-1016) plane. FIG. 19 is a drawing showing atomic arrangements in the (20-21) plane, (-101-7) plane, and (-1017) plane. FIG. 20 is a drawing showing atomic arrangements in the (20-21) plane, (-101-8) plane, and (-1018) plane. As shown in FIGS. 18 to 20, local atom arrangements indicated by arrows show configurations of atoms with charge neutrality, and electrically neutral arrangements of atoms appear periodically. The reason why the near-vertical faces with respect to the grown surface are obtained can be that creation of fractured faces is considered to be relatively stable because of the periodic appearance of the neutral atomic configurations in terms of charge.

According to various experiments containing the above-described Examples, the angle ALPHA can be in a range of not less than 45° and not more than 80° or in a range of not less than 100° and not more than 135°. In order to improve the laser chip yield, the angle ALPHA can be in a range of not less than 63° and not more than 80° or in a range of not less than 100° and not more than 117°. The typical semipolar principal surface can be any one of {20-21} plane, {10-11} plane, {20-2-1} plane, and {10-1-1} plane. Furthermore, the principal surface can be a slight tilt surface from these semipolar surfaces. For example, the semipolar principal surface can be a slight tilt surface off in a range of not less than −4° and not more than +4° toward the m-plane with respect to any one of {20-21} plane, {10-11} plane, {20-2-1} plane, and {10-1-1} plane.

As described above, the embodiments provide the group-III nitride semiconductor laser device with the laser cavity enabling the low threshold current, on the semipolar surface of the support base the c-axis of the hexagonal group-III nitride of which tilts toward the m-axis. And the embodiments provide the method for fabricating this group-III nitride semiconductor laser device.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A group-III nitride semiconductor laser device comprising:
a laser structure including a support base and a semiconductor region, the support base comprising a hexagonal group-III nitride semiconductor and having a semipolar principal surface, and the semiconductor region being provided on the semipolar principal surface of the support base; and
an electrode being provided on the semiconductor region of the laser structure,
the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer,
the first cladding layer, the second cladding layer, and the active layer being arranged along a normal axis to the semipolar principal surface,
the active layer including a gallium nitride-based semiconductor layer,
a c-axis of the hexagonal group-III nitride semiconductor of the support base tilting at a finite angle ALPHA with respect to the normal axis toward an m-axis of the hexagonal group-III nitride semiconductor, the angle ALPHA being in a range of not less than 45° and not more than 80° or in a range of not less than 100° and not more than 135°,
the laser structure comprising first and second fractured faces, the first and second fractured faces intersecting with an m-n plane defined by the m-axis of the hexagonal group-III nitride semiconductor and the normal axis,
a laser cavity of the group-III nitride semiconductor laser device including the first and second fractured faces,
the laser structure including first and second surfaces, the second surface being opposite to the first surface,
the semiconductor region being located between the first surface and the support base,
each of the first and second fractured faces extending from an edge of the first surface to an edge of the second surface,
the laser structure having a scribed mark, the scribed mark extending from the edge of the first surface to the edge of the second surface, at one end of the first fractured face, and
the scribed mark having a depressed shape, the depressed shape extending from the edge of the first surface to the edge of the second surface.

2. The group-III nitride semiconductor laser device according to claim 1, wherein an end face of the support base and an end face of the semiconductor region are exposed in each of the first and second fractured faces, and
wherein an angle between the end face in the active layer of the semiconductor region and a reference plane perpendicular to the m-axis of the support base of the hexagonal nitride semiconductor is in a range of not less than (ALPHA−5)° and not more than (ALPHA+5)° in a first plane defined by the c-axis and the m-axis of the group-III nitride semiconductor.

3. The group-III nitride semiconductor laser device according to claim 1, wherein the angle is in a range of not less than −5° and not more than +5° on a second plane perpendicular to the first plane and the normal axis.

4. The group-III nitride semiconductor laser device according to claim 1, wherein a thickness of the support base is not less than 50 μm and not more than 150 μm.

5. The group-III nitride semiconductor laser device according to claim 1, wherein the angle between the normal axis and the c-axis of the hexagonal group-III nitride semiconductor falls within a range of not less than 63° and not more than 80° or within a range of not less than 100° and not more than 117°.

6. The group-III nitride semiconductor laser device according to claim 1, wherein laser light from the active layer is polarized in a direction of an a-axis of the hexagonal group-III nitride semiconductor.

7. The group-III nitride semiconductor laser device according to claim 1, wherein light in an LED mode of the group-III nitride semiconductor laser device includes a polarization component I1 in a direction of an a-axis of the hexagonal group-III nitride semiconductor, and a polarization component I2 in a direction indicated by a projection of the c-axis of the hexagonal group-III nitride semiconductor onto the principal surface, and wherein the polarization component I1 is greater than the polarization component I2.

8. The group-III nitride semiconductor laser device according to claim 1, wherein the semipolar principal surface is slightly tilted in a range of not less than −4° and not more than +4° with respect to any one of {20-21} plane, {10-11} plane, {20-2-1} plane, and {10-1-1} plane.

9. The group-III nitride semiconductor laser device according to claim 1, wherein the semipolar principal surface is one of {20-21} plane, {10-11} plane, {20-2-1} plane, and {10-1-1} plane.

10. The group-III nitride semiconductor laser device according to claim 1, wherein a stacking fault density of the support base is not more than $1 \times 10^4$ cm$^{-1}$.

11. The group-III nitride semiconductor laser device according to claim 1, wherein the support base comprises any one of GaN, AlGaN, AlN, InGaN, and InAlGaN.

12. The group-III nitride semiconductor laser device according to claim 1, further comprising a dielectric multilayer film provided on at least one of the first and second fractured faces.

13. The group-III nitride semiconductor laser device according to claim 1, wherein the active layer includes a light emitting region provided so as to generate light at a wavelength of not less than 360 nm and not more than 600 nm.

14. The group-III nitride semiconductor laser device according to claim 1, wherein the active layer includes a quantum well structure provided so as to generate light at a wavelength of not less than 430 nm and not more than 550 nm.

15. A group-III nitride semiconductor laser device comprising:

a laser structure including a support base and a semiconductor region, the support base comprising a hexagonal group-III nitride semiconductor and having a semipolar principal surface, the semiconductor region being provided on the semipolar principal surface of the support base; and an electrode being provided on the semiconductor region of the laser structure, the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the support base tilting at a finite angle ALPHA with respect to the normal axis toward an m-axis of the hexagonal group-III nitride semiconductor, the angle ALPHA being in a range of not less than 45° and not more than 80° or in a range of not less than 100° and not more than 135°, the laser structure including first and second surfaces, the second surface being opposite to the first surface, the semiconductor region being located between the first surface and the support base, the laser structure having first and second scribed marks, the first and second scribed marks being provided at an end of the laser structure and extending along a plane defined by an a-axis of the hexagonal group-III nitride semiconductor and the normal axis, each of the first and second scribed marks having a depressed shape, the depressed shape extending from an edge of the first surface to an edge of the second surface, the end of the laser structure having a fractured face, the fractured face connecting respective edges of the first and second scribed marks with the respective edges of the first and second surfaces, and a laser cavity of the group-III nitride semiconductor laser device including the fractured face.

* * * * *